(12) United States Patent
Tsuboi

(10) Patent No.: US 10,811,432 B2
(45) Date of Patent: Oct. 20, 2020

(54) SEMICONDUCTOR DEVICE AND METHOD OF MANUFACTURING THE SAME

(71) Applicant: RENESAS ELECTRONICS CORPORATION, Tokyo (JP)

(72) Inventor: Nobuo Tsuboi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 4 days.

(21) Appl. No.: 16/154,432

(22) Filed: Oct. 8, 2018

(65) Prior Publication Data
US 2019/0181157 A1 Jun. 13, 2019

(30) Foreign Application Priority Data

Dec. 12, 2017 (JP) ................. 2017-237714

(51) Int. Cl.
*H01L 27/12* (2006.01)
*H01L 29/66* (2006.01)
(Continued)

(52) U.S. Cl.
CPC ...... *H01L 27/1207* (2013.01); *H01L 21/0337* (2013.01); *H01L 21/76283* (2013.01); *H01L 21/76832* (2013.01); *H01L 21/76877* (2013.01); *H01L 21/76897* (2013.01); *H01L 21/823864* (2013.01); *H01L 21/823871* (2013.01);
(Continued)

(58) Field of Classification Search
CPC ............ H01L 27/1207; H01L 21/0337; H01L 21/76283; H01L 21/76832; H01L 21/76877; H01L 21/76897; H01L 21/823864; H01L 21/823871; H01L 21/823878; H01L 27/0928; H01L 29/517; H01L 29/6656; H01L 29/78;
(Continued)

(56) References Cited

U.S. PATENT DOCUMENTS 9,130,039 B2 9/2015 Yamamoto et al.
9,887,211 B2 2/2018 Yamamoto
(Continued)

FOREIGN PATENT DOCUMENTS

| JP | 2014-038878 A | 2/2014 |
|---|---|---|
| JP | 2014-143269 A | 8/2014 |
| JP | 2014-236097 A | 12/2014 |

*Primary Examiner* — Fernando L Toledo
*Assistant Examiner* — Neil R Prasad
(74) *Attorney, Agent, or Firm* — McDermott Will & Emery LLP

(57) ABSTRACT

There is provided with the following semiconductor device to improve its reliability. In a SOI substrate including a semiconductor substrate, an insulating layer, and a semiconductor layer, a diffusion region is formed in the semiconductor layer and a plug electrically connected to the diffusion region is formed on the diffusion region. An element isolation portion is formed within the semiconductor substrate and a trench is formed in the element isolation portion. The lowest part of the bottom of the trench is lower than the surface of the semiconductor substrate and a sidewall spacer is formed in the side portion of the trench to cover the side surface of the insulating layer. As the result, even when the plug is formed in a deviated position, a disadvantage of conducting the semiconductor layer with the semiconductor substrate can be suppressed.

11 Claims, 28 Drawing Sheets

(51) Int. Cl.
*H01L 29/51* (2006.01)
*H01L 27/092* (2006.01)
*H01L 29/78* (2006.01)
*H01L 21/768* (2006.01)
*H01L 21/8238* (2006.01)
*H01L 21/033* (2006.01)
*H01L 21/762* (2006.01)
*H01L 27/088* (2006.01)
*H01L 21/8234* (2006.01)

(52) U.S. Cl.
CPC .. *H01L 21/823878* (2013.01); *H01L 27/0928* (2013.01); *H01L 29/517* (2013.01); *H01L 29/6656* (2013.01); *H01L 29/78* (2013.01); *H01L 21/823412* (2013.01); *H01L 21/823418* (2013.01); *H01L 21/823468* (2013.01); *H01L 27/088* (2013.01); *H01L 27/0922* (2013.01)

(58) Field of Classification Search
CPC ..... H01L 21/823412; H01L 21/823418; H01L 21/823468; H01L 27/088; H01L 27/0922
See application file for complete search history.

(56) References Cited

U.S. PATENT DOCUMENTS

| | | |
|---|---|---|
| 2010/0032761 A1* | 2/2010 | Ding ............... H01L 21/823462 257/350 |
| 2010/0167505 A1* | 7/2010 | Chew ................ H01L 21/02532 438/503 |
| 2013/0087855 A1* | 4/2013 | Makiyama .............. H01L 21/84 257/350 |
| 2015/0187755 A1* | 7/2015 | Mehrotra ............ H01L 29/7378 257/192 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2017-237714 filed on Dec. 12, 2017 including the specification, drawings and abstract is incorporated herein by reference in its entirety.

BACKGROUND

The invention relates to a semiconductor method of and manufacturing the same, and, for example, to a technique effectively applied to a semiconductor device using SOI substrate.

As a semiconductor device designed for small power consumption, there is a technique of forming a Metal Insulator Semiconductor Field Effect Transistor (MISFET) on a Silicon On Insulator (SOI) substrate including a semiconductor substrate, an insulating layer formed on the semiconductor substrate, and a silicon layer formed on the insulating layer. The MISFET formed on the SOI substrate can reduce parasitic capacity caused by a diffusion region formed in the silicon layer. This can improve the operation speed of the MISFET and reduce the power consumption.

Further, in the semiconductor device using the SOI substrate, there is a case where SOI-MISFET formed on the silicon layer and bulk-MISFET formed on the semiconductor substrate (bulk substrate) with the silicon layer and the insulating layer removed therefrom are mounted in a mixed way.

For example, Japanese Unexamined Patent Application Publication No. 2014-143269 discloses a semiconductor device having the above SOI-MISFET and bulk-MISFET in a mixed way and a technique of adjusting the height of the surface of the isolation insulating film between the SOI-MISFET and the bulk-MISFET.

Further, Japanese Unexamined Patent Application Publication No. 2014-38878 discloses a technique of forming an epitaxial layer on the silicon layer that becomes a source region and a drain region, using a first sidewall spacer, then, removing the first sidewall spacer, and continuously forming a second sidewall spacer on the top surface and the side surface of the epitaxial layer, in the above mentioned SOI-MISFET.

Japanese Unexamined Patent Application Publication No. 2014-236097 discloses a technique of preventing a plug from being connected to a semiconductor substrate when the plug is formed in a deviate position, by forming the epitaxial layer designed on the silicon layer that becomes a source region or a drain region larger than the silicon layer in the width.

SUMMARY

In the MISFET formed on the SOI substrate, driving current of the MISFET is controlled by applying a voltage not only to a gate electrode formed on the silicon layer but also a well region formed on the semiconductor substrate. Here, when the plug for coupling with the source region or the drain region of the MISFET is formed in a deviated position into contact with the semiconductor substrate, a malfunction occurs in the MISFET.

Other problems and novel characteristics will be apparent from the description of the specification and the attached drawings.

According to one embodiment, a semiconductor device includes a semiconductor substrate, an insulating layer, and a semiconductor layer. The semiconductor device includes a impurity region formed in the semiconductor layer, a plug which is electrically connected to the impurity region, and an element isolation portion formed in the semiconductor substrate. Here, a trench is formed in the element isolation portion, the lowest part of the bottom of the trench is lower than the surface of the semiconductor substrate, and a first sidewall spacer is formed in the side surface of the trench to cover the side surface of the semiconductor substrate and the side surface of the insulating layer.

According to one embodiment, a reliability of the semiconductor device can be improved.

DETAILED DESCRIPTION

Figure 1:
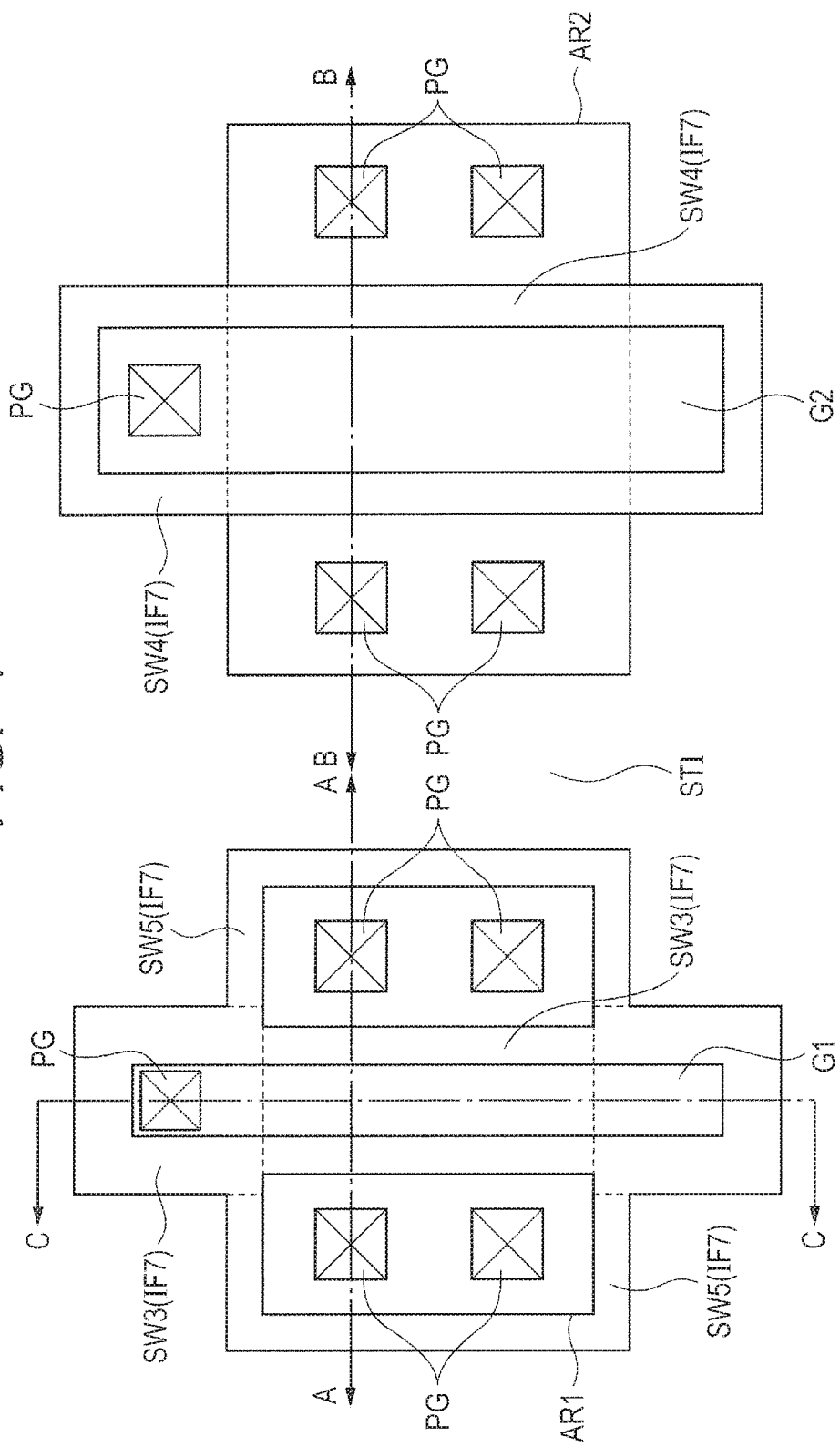
FIG. 1 is a plan view showing a semiconductor device according to a first embodiment.

In the following description, the subject matter will be divided into a plurality of sections or embodiments if necessary for the sake of convenience; however, they are not unrelated to each other unless otherwise specified, but are in such a relation that one represents a modification example, the details, the supplementary explanation, or the like of a part or all of the other. Further, in the following embodiments, if reference is made to any number of elements or the like (including the number of units, numeric value, quantity, range, and the like), the invention is not to be restricted to that but the number may be more or less than a specific value unless otherwise explicitly specified and apparently restricted to the specific value in principle. Further, in the following embodiments, the components (including the operational steps) are not necessarily essential unless otherwise specifically stated and apparently considered to be essential in principle. Similarly, in the following embodiments, if reference is made to a shape, positional relationship, or the like of any component or the like, those substantially approximate or similar to that shape or the like are to be included unless otherwise specifically stated and apparently considered to be different in principle. This is the same with the above-mentioned numeric value and range.

Hereinafter, one embodiment will be described with reference to the drawings. In all the drawings, the same reference codes are attached to the same materials having the same functions and their repeated description is omitted. Further, in the following embodiment, a description of the same or similar part will not be repeated unless otherwise necessary.

In the drawings used in the embodiment, hatching may be omitted for the easy viewing of the drawings.

First Embodiment

Figure 2:
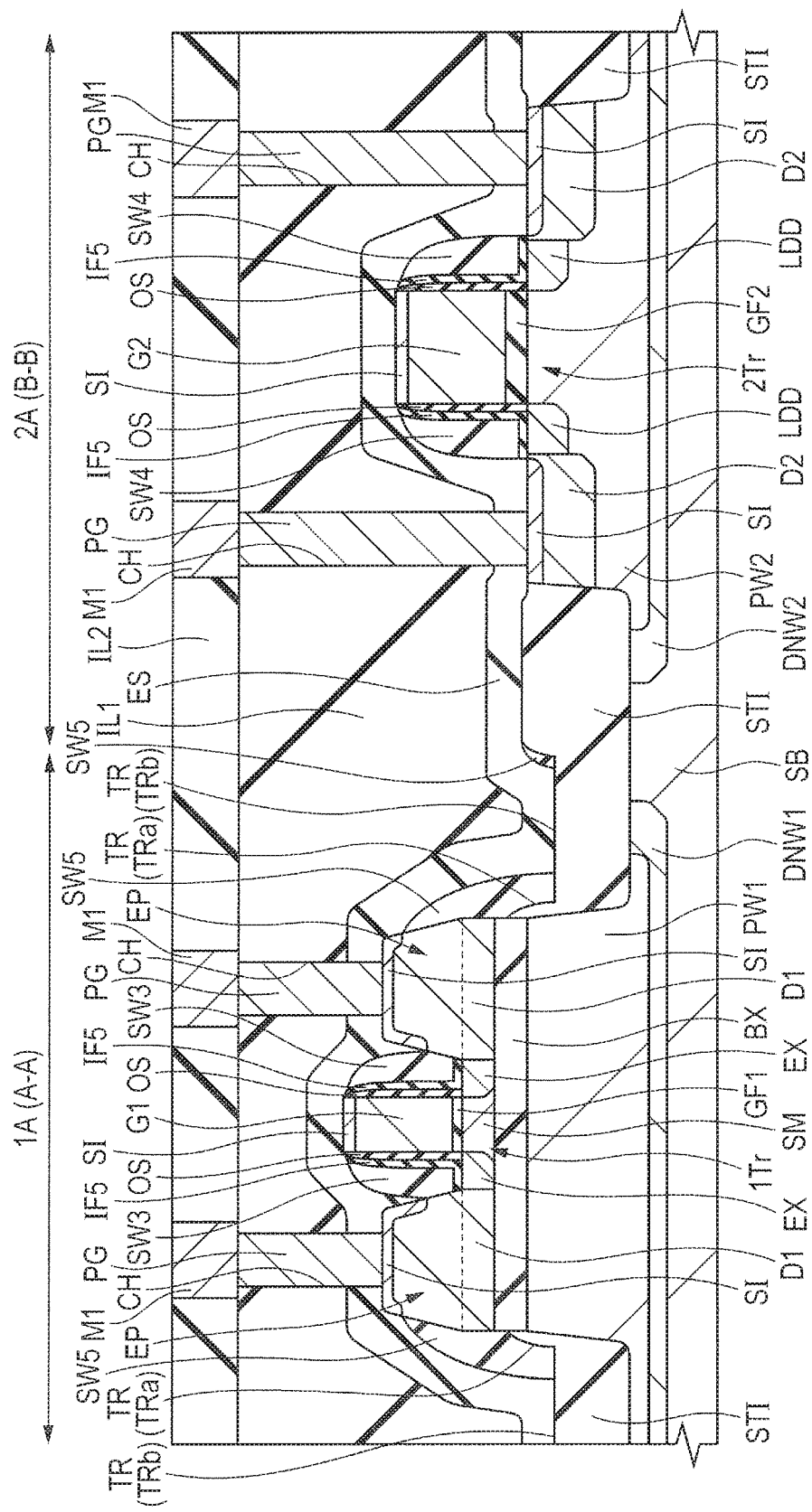
FIG. 2 is a cross-sectional view showing the semiconductor device according to the first embodiment, taken along the line A-A and the line B-B in FIG. 1.
Figure 3:
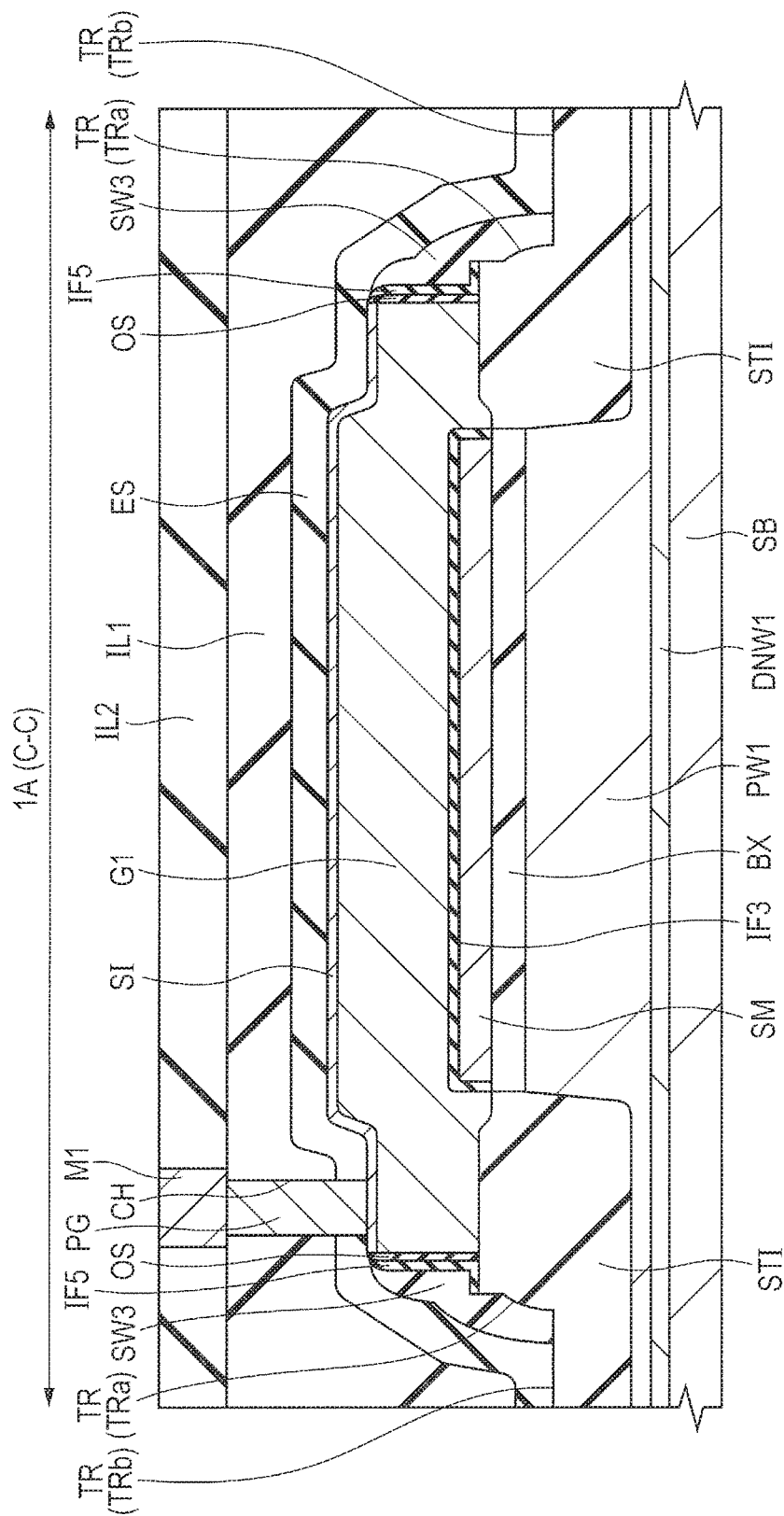
FIG. 3 is a cross-sectional view showing the semiconductor device according to the first embodiment, taken along the line C-C in FIG. 1.

FIG. 1 shows a plan structure of n-type MISFET 1Tr and n-type MISFET 2Tr as a semiconductor device of an embodiment. The semiconductor device according to the embodiment includes an area 1A where the MISFET 1Tr is formed and an area 2A where the MISFET 2Tr is formed. In FIG. 2, the area 1A shows the cross-sectional view corresponding to the line A-A in FIG. 1, and the area 2A shows the cross-sectional view corresponding to the line B-B in FIG. 1. FIG. 3 shows the cross-sectional view corresponding to the line C-C in FIG. 1.

At first, a plan structure of the semiconductor device according to the embodiment will be described using FIG. 1. FIG. 1 shows only main characteristic components of the embodiment such as a gate electrode G1, a gate electrode G2, sidewall spacers SW3 to SW5, and a plug PG and the other components shown in FIGS. 2 and 3 are not illustrated here.

As shown in FIG. 1, the MISFET 1Tr and the MISFET 2Tr are respectively formed in an active region AR1 and an active region AR2. The active region AR1 and the active region AR2 are the areas divided by an element isolation portion ST1 formed on the semiconductor substrate SB. The active region AR1 is a semiconductor layer SM in the area 1A of FIG. 2, where an extension region EX and a diffusion region D1 as the source region and the drain region of the MISFET 1Tr are mainly formed. The active region AR2 is a semiconductor substrate SB in the area 2A of FIG. 2, where mainly an impurity region LDD and a diffusion region D2 as the source region and drain region of the MISFET 2Tr are mainly formed. Further, a plurality of plugs PG are arranged on the active region AR1 and the active region AR2.

The gate electrode G1 of the MISFET 1Tr is formed in a way of overstriding the active region AR1 and the element isolation portion ST1. In plan view, a sidewall spacer SW3 is formed on the side surface of the gate electrode G1 and a sidewall spacer SW5 is formed on the element isolation portion ST1 around the active region AR1. In short, the sidewall spacer SW5 is formed on the side surface of the semiconductor layer SM forming the active region AR1 in a gate length direction and a gate width direction of the MISFET 1Tr. These sidewall spacers SW3 and SW5 are made of the same insulating film IF7 and actually integrated with the above film; for easy understanding of the invention, however, these are separately illustrated here.

The gate electrode G2 of the MISFET 2Tr is formed in a way of overstriding the active region AR2 and the element isolation portion ST1. In plan view, a sidewall spacer SW4 is formed on the side surface of the gate electrode G2. The sidewall spacer SW4 is made of the same insulating film IF7 likes the sidewall spacer SW3 and the sidewall spacer SW5; however, it is separated from the sidewall spacer SW3 and the sidewall spacer SW5.

A cross-sectional structure of the semiconductor device according to the embodiment will be described using FIGS. 2 and 3.

In the area 1A, an insulating layer BX is formed on the semiconductor substrate SB and a semiconductor layer SM is formed on the insulating layer BX. The thickness of the insulating layer BX is about 10 to 20 nm, and the thickness of the semiconductor layer SM is about 10 to 20 nm. In the area 2A, the insulating layer BX and the semiconductor layer SM are removed. In the area 1A and the area 2A, the element isolation portion ST1 is formed in the semiconductor substrate SB.

The n-type MISFET 1Tr is formed in the area 1A. The MISFET 1Tr is the MISFET having the lower withstand voltage than the MISFET 2Tr and driven with a low voltage of 0.75 V, as a semiconductor element used for a logic circuit or Static Random Access Memory (SRAM) circuit. In the area 1A, a p-typed low withstand MISFET is also formed but its description is omitted here.

In the area 1A, an n-type well region DNW1 is formed in the semiconductor substrate SB, and a p-type well region PW1 is formed within the well region DNW1. This well region DNW1 electrically separates the well region PW1 from the p-type semiconductor substrate SB. A p-type ground plane region having a higher impurity concentration than the well region PW1 is formed on the surface of the well region PW1 in contact with the insulating layer BX; however, the ground plane region is not illustrated here. The well region PW1 is the region where a voltage different from that of the gate electrode G1 is applied, for controlling the driving current of the MISFET 1Tr, together with the gate electrode G1. In short, the well region PW1 works as a second gate electrode of the MISFET 1Tr.

The gate electrode G1 is formed on the semiconductor layer SM in the area 1A through a gate insulating film GF1. Here, the gate insulating film GF1 is a single layer film made of an insulating film such as a silicon oxide film or a film stack including a silicon oxide film and a high dielectric constant film containing hafnium, aluminum, or the like. Further, the gate electrode G1 is a single layer film made of a conductive film such as a polycrystalline silicon film or a film stack including a polycrystalline silicon film and a metal film containing titanium nitride, tungsten, or the like.

An insulating film IF5 is formed on the lateral side of the gate electrode G1 through an offset spacer OS and the sidewall spacer SW3 is formed on the insulating film IF5. An extension region EX as an n-type impurity region having a lower concentration is formed in the semiconductor layer SM under the offset spacer OS, the insulating film IF5, and the sidewall spacer SW3. An epitaxial layer EP is formed on a part of the semiconductor layer SM. A diffusion region D1 as the n-type impurity region having a higher concentration than the extension region EX is formed in the epitaxial layer EP and the semiconductor layer SM. These extension region EX and diffusion region D1 form the source region and the drain region of the MISFET 1Tr.

In the area 2A, the n-type MISFET 2Tr is formed. The MISFET 2Tr is the MISFET having a higher withstand voltage than the MISFET 1Tr and driven with a high voltage of about 3.3 V, as a semiconductor element used for Input/Output (I/O) circuit. In the area 2A, a p-typed high withstand voltage MISFET is also formed; however, its description is omitted here.

In the area 2A, an n-type well region DNW2 is formed in the semiconductor substrate SB, and a p-type well region PW2 is formed within the well region DNW2. This well region DNW2 electrically separates the well region PW2 from the p-type semiconductor substrate SB.

The gate electrode G2 is formed on the semiconductor substrate SB in the area 2A through a gate insulating film GF2. Here, the gate insulating film GF2 is a single layer film including the insulating film such as a silicon oxide film or a film stack including a silicon oxide film and a high dielectric constant film containing hafnium, aluminum, or the like. The thickness of the gate insulating film GF2 is larger than that of the gate insulating film GF1. The gate electrode G2 is a single layer film including a conductive film such as polycrystalline silicon or a film stack including a polycrystalline silicon film and a metal film containing titanium nitride, tungsten, or the like.

The insulating film IF5 is formed on the lateral side of the gate electrode G2 through the offset spacer OS and the sidewall spacer SW4 is formed on the insulating film IF5. The impurity region LDD as the n-type impurity region having a lower concentration is formed in the semiconductor substrate SB under the offset spacer OS, the insulating film IF5, and the sidewall spacer SW4. Further, a diffusion region D2 as the n-type impurity region having a higher concentration than the impurity region LDD is formed in the semiconductor substrate SB from the side of the sidewall SW4. These impurity region LDD and diffusion region D2 form the source region and the drain region of the MISFET 2Tr.

A silicide layer SI including, for example, nickel silicide (NiSi) or cobalt silicide ($CoSi_2$) is formed on the gate electrode G1, the gate electrode G2, the diffusion region D1, and the diffusion region D2, to reduce contact resistance with the plug PG.

In the area 1A, a trench TR is formed in the element isolation portion ST1 and the sidewall spacer SW5 made of the insulating film such as a silicon nitride film is formed on the lateral side TRa of the trench TR. As mentioned above, the sidewall spacer SW5 is integrated with the sidewall spacer SW3. Further, as shown in FIGS. 1 and 3, the width of the sidewall spacer SW3 formed in the trench TR of the element isolation portion ST1 and formed on the side surface of the gate electrode G1 is formed wider than the width of the sidewall spacer SW5 formed around the active region AR1 and the width of the sidewall spacer SW3 formed on the side surface of the gate electrode G1 in the active region AR1. The details about the trench TR and the sidewall spacer SW5 will be described later.

An etching stopper film (insulating film) ES is formed on the main surfaces of the area 1A and the area 2A, to cover the MISFET 1Tr and the MISFET 2Tr, and an interlayer insulating film IL1 is formed on the etching stopper film ES. The etching stopper film ES is made of, for example, a silicon nitride film. The interlayer insulating film IL1 is made of, for example, a silicon oxide film. Contact holes CH are bored across the interlayer insulating film IL1 and the etching stopper film ES, and a plurality of plugs PG are formed by filling the contact holes CH with the conductive film mainly made of tungsten (W). Each plug PG is electrically connected to the gate electrode G1, the gate electrode G2, the diffusion region D1, and the diffusion region D2 through the silicide layer SI.

The interlayer insulating film IL2 is formed on the interlayer insulating film IL1 with the plugs PG embedded. Each trench for wiring is formed in the interlayer insulating film IL2, and each wiring M1 for coupling with each plug PG is formed within the interlayer insulating film IL2 by filling each trench for wiring with, for example, the conductive film mainly made of copper.

<Main Characteristics of Semiconductor Device>

Figure 4:
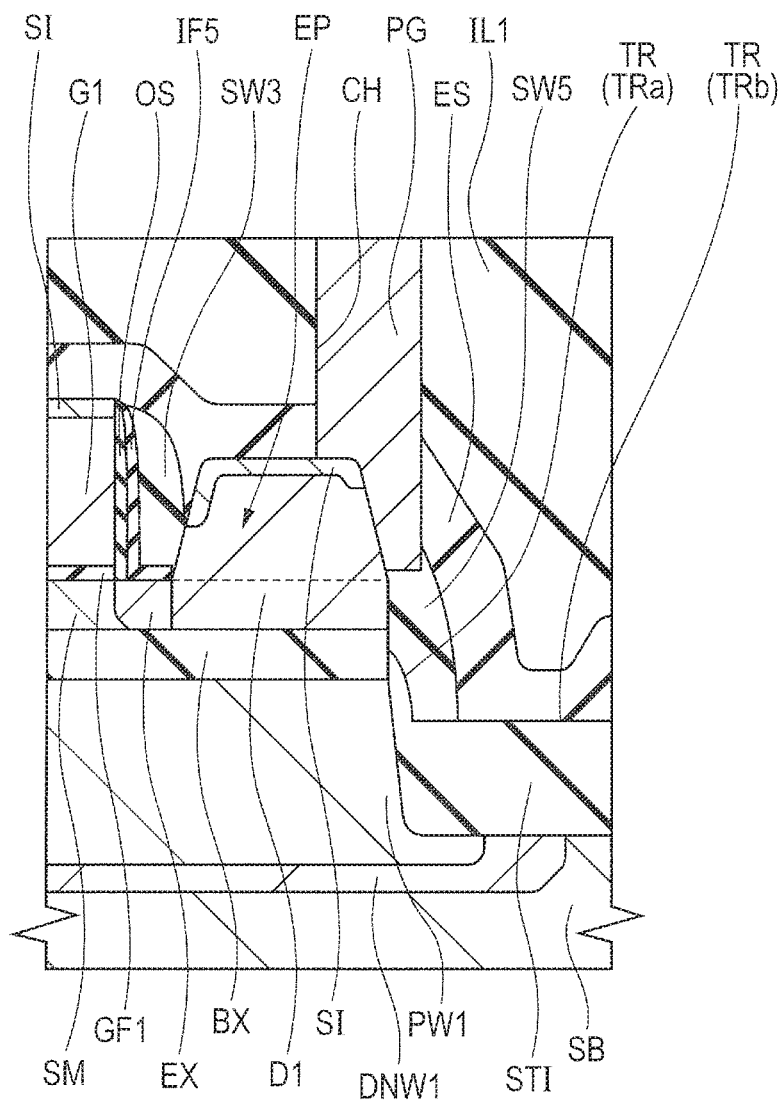
FIG. 4 is an enlarged view of an important portion of the cross-sectional view showing the semiconductor device according to the first embodiment.

FIG. 4 is an enlarged view of an important portion of the area 1A shown in FIG. 2, indicating the state in which the plug PG is formed in a deviated position because of mask deviation.

Under normal condition, the plug PG is formed on the silicide layer SI on the epitaxial layer EP, as shown in FIG. 2. When the plug PG is deviated as shown in FIG. 4, there is a fear that the plug PG may arrive at the well region PW1 under the insulating layer BX. In the MISFET 1Tr according to the embodiment, the mutually different voltages are applied respectively to the diffusion region D1 that becomes the source region or drain region and the well region PW12 that becomes the second gate electrode. Therefore, when the plug PG is deviated and the diffusion region D1 is conducted with the well region PW1, a malfunction occurs in the MISFET 1Tr.

In the embodiment, the trench TR is formed on the surface of the element isolation portion ST1 and the lateral side TRa of the trench TR is covered with the sidewall spacer SW5. This sidewall spacer SW5 is provided to suppress the above defect of conducting the diffusion region D1 with the well region PW1, when the plug PG is deviated. Specifically, even when the plug PG is formed in a way of overstriding the diffusion region D1 and the element isolation portion ST1, the bottom of the plug G on the element isolation portion ST1 can be supposed on the sidewall spacer SW5, hence to suppress the above defect. To suppress this defect, the height of the sidewall spacer SW5 (the thickness in the film thickness direction) has to be secured enough.

In the embodiment, the sidewall spacer SW5 is formed in the lateral side TRa of the trench TR to cover at least the side surface of the insulating layer BX and the side surface of the semiconductor substrate SB. More preferably, the sidewall spacer SW5 is formed to cover the side surface of the epitaxial layer EP, the side surface of the semiconductor layer SM, the side surface of the insulating layer BX, and the side surface of the semiconductor substrate SB. In other words, the upmost end portion of the sidewall spacer SW5 is preferably positioned above the boundary between the insulating layer BX and the semiconductor substrate SB, more preferably above the boundary between the semiconductor layer SM and the insulating layer BX, and further more preferably above the boundary between the epitaxial layer EP and the semiconductor layer SM. Further, the undermost end portion of the sidewall spacer SW5 is preferably positioned below the boundary between the semiconductor substrate SB and the insulating layer BX.

To fully secure the height (thickness) of the sidewall spacer SW5, the trench TR is formed with a depth lower than the boundary between the insulating layer BX and the semiconductor substrate SB in the area 1A. In other words, the lowest part of the bottom TRb of the trench TR is lower than the surface of the semiconductor substrate SB and lower than the surface of the element isolation portion ST1 in the area 2A.

The side portion TRa of the trench TR is formed by a part of the element isolation portion ST1 left in a spacer shape. In other words, the side surface of the semiconductor substrate SB is covered with a part of the element isolation portion ST1. Therefore, the sidewall spacer SW5 covers the side surface of the semiconductor substrate SB through a part of the element isolation portion ST1. Therefore, at a time of forming the plug PG, even when the contact hole CH penetrates the sidewall spacer SW5, a part of the element isolation portion ST1 formed on the side surface of the semiconductor substrate SB works as an etching stopper, hence to suppress the conduction of the semiconductor layer SM with the semiconductor substrate SB.

As mentioned above, in the embodiment, the sidewall spacer SW5 is provided within the trench TR, which can suppress the conduction of the diffusion region D1 formed in the semiconductor layer SM with the well region PW1 formed in the semiconductor substrate SB, hence to improve a reliability of the semiconductor device.

CONSIDERATION EXAMPLE

Figure 5:
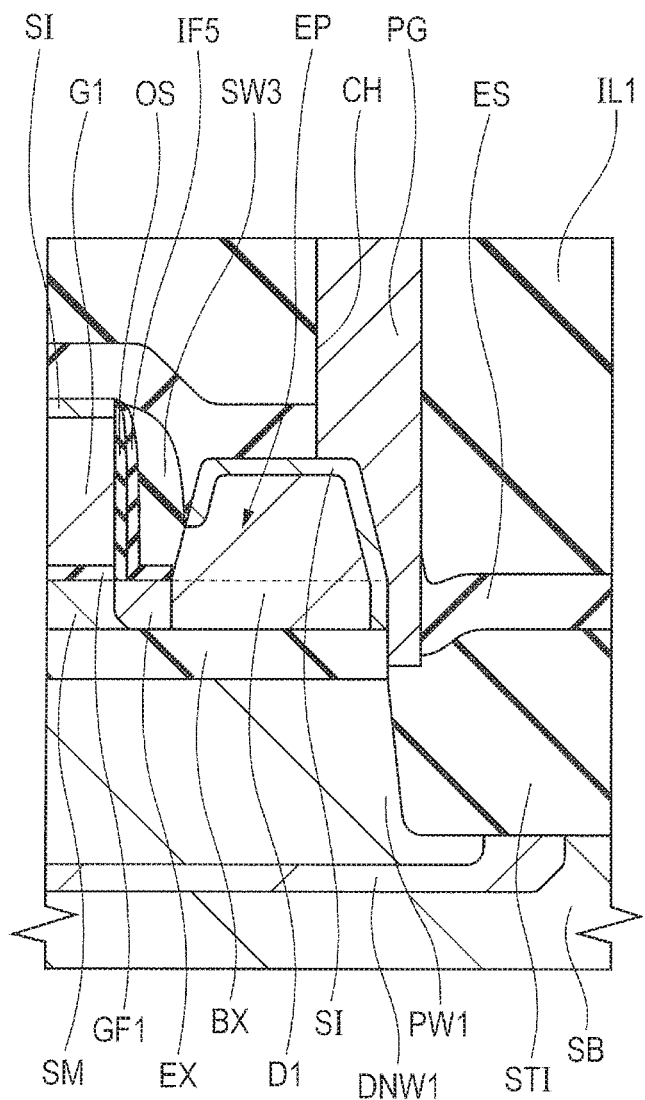
FIG. 5 is a cross-sectional view showing a semiconductor device of a consideration example.

FIG. 5 is a cross-sectional view of a consideration example, showing the deviated state of the plug PG according to the mask deviation, similarly to FIG. 4.

In the consideration example, the trench TR and the sidewall spacer SW5 are not formed, differently from the embodiment. Therefore, when a mask deviation occurs at the time of forming the contact hole CH, the bottom of the contact hole CH gets very close to the semiconductor substrate SB, to deteriorate the insulation resistance therebetween. In the worst case, the bottom of the contact hole CH arrives at the semiconductor substrate SB and the semiconductor layer SM is conducted with the semiconductor substrate SB disadvantageously at the time of forming the plug PG.

The surface of the element isolation portion ST1 is positioned near the surface of the semiconductor substrate SB, according to the etching process and the washing process performed in each manufacturing process. Further, in the semiconductor device according to the embodiment and the consideration example, the SOI substrate is used, and the thickness of the insulating layer BX is very thin, 10 to 20 nm. Therefore, the transistor formed on the SOI substrate like the MISFET 1Tr in the area 1A is easily subject to the conductive defect of the semiconductor layer SM and the semiconductor substrate SB caused by the deviation of the plug PG, differently from the transistor formed on the semiconductor substrate SB like the MISFET 2Tr in the area 2A. In short, it is important that some countermeasure is taken against the positional deviation of the plug PG in the vicinity of the boundary between the element isolation portion ST1 and the semiconductor substrate SB. To improve the reliability of the semiconductor device, it is very effective to provide the sidewall spacer SW5 like the embodiment.

<Manufacturing Method of Semiconductor Device>

A method of manufacturing the semiconductor device according to the embodiment will be described using FIGS. 6 to 23.

Figure 6:
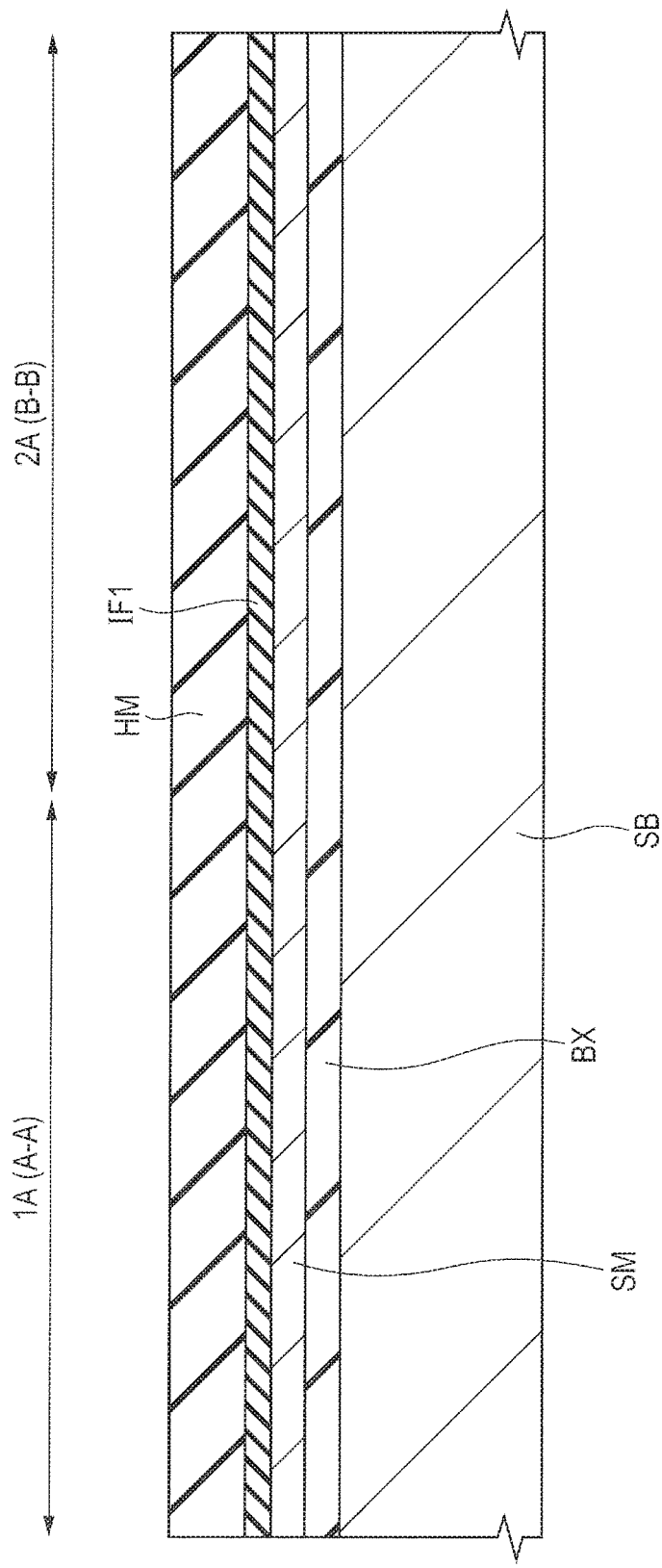
FIG. 6 is a cross-sectional view showing the manufacturing process of the semiconductor device according to a first embodiment.

FIG. 6 shows a so-called SOI substrate including the semiconductor substrate SB as a supporting substrate, the insulating layer BX formed on the semiconductor substrate SB, and the semiconductor layer SM formed on the insulating layer BX, in the area 1A and the area 2A.

The semiconductor substrate SB is preferably made of single crystal silicon having a resistivity of about 1 to 10 $\Omega$cm, for example, p-type single crystal silicon. The insulating layer BX is made of, for example, silicon oxide, with the thickness of, for example, about 10 to 20 nm. The semiconductor layer SM is preferably made of single crystal silicon having a resistivity of 1 to 10 $\Omega$cm, with the thickness of, for example, about 10 to 20 nm. The semiconductor layer SM is an intrinsic semiconductor layer without any n-type and p-type impurity introduced according to the ion implantation. Alternatively, even when the p-type impurity is introduced into the semiconductor layer SM, the impurity concentration is $1\times10^{13}/cm^3$ and less.

One example of the process of providing this SOI substrate will be hereinafter described. The SOI substrate can be manufactured, for example, according to the Separation by IMplanted Oxygen (SIMOX) method. In the SIMOX method, oxygen ($O_2$) is ion implanted to a semiconductor substrate made of silicon (Si) with high energy, to combine the silicon and the oxygen according to the thermal processing, and the insulating layer BX made of silicon oxide is formed at a position a little deeper than the surface of the semiconductor substrate In this case, a silicon thin film remaining on the insulating layer BX becomes the semiconductor layer SM, and the semiconductor substrate under the insulating layer BX becomes the semiconductor substrate SB. Further, the SOI substrate may be formed according to a laminating method. In the laminating method, for example, after forming the insulating layer BX by oxidizing the surface of a first semiconductor substrate made of silicon, a second semiconductor substrate made of silicon is laminated to the first semiconductor substrate under high temperature, and then, the second semiconductor substrate is thinned. In this case, a thin film of the second semiconductor substrate remaining on the insulating layer BX becomes the semiconductor layer SM and the first semiconductor substrate under the insulating layer BX becomes the semiconductor substrate SB. Further, the SOI substrate can be manufactured according to the other method, for example, smart cut process.

Next, the insulating film IF1, for example, made of silicon oxide film is formed on the semiconductor layer SM, and the hard mask HM, for example, made of silicon nitride film is formed on the insulating film IF1. The thickness of the insulating film IF1 is about 5 to 10 nm.

Figure 7:
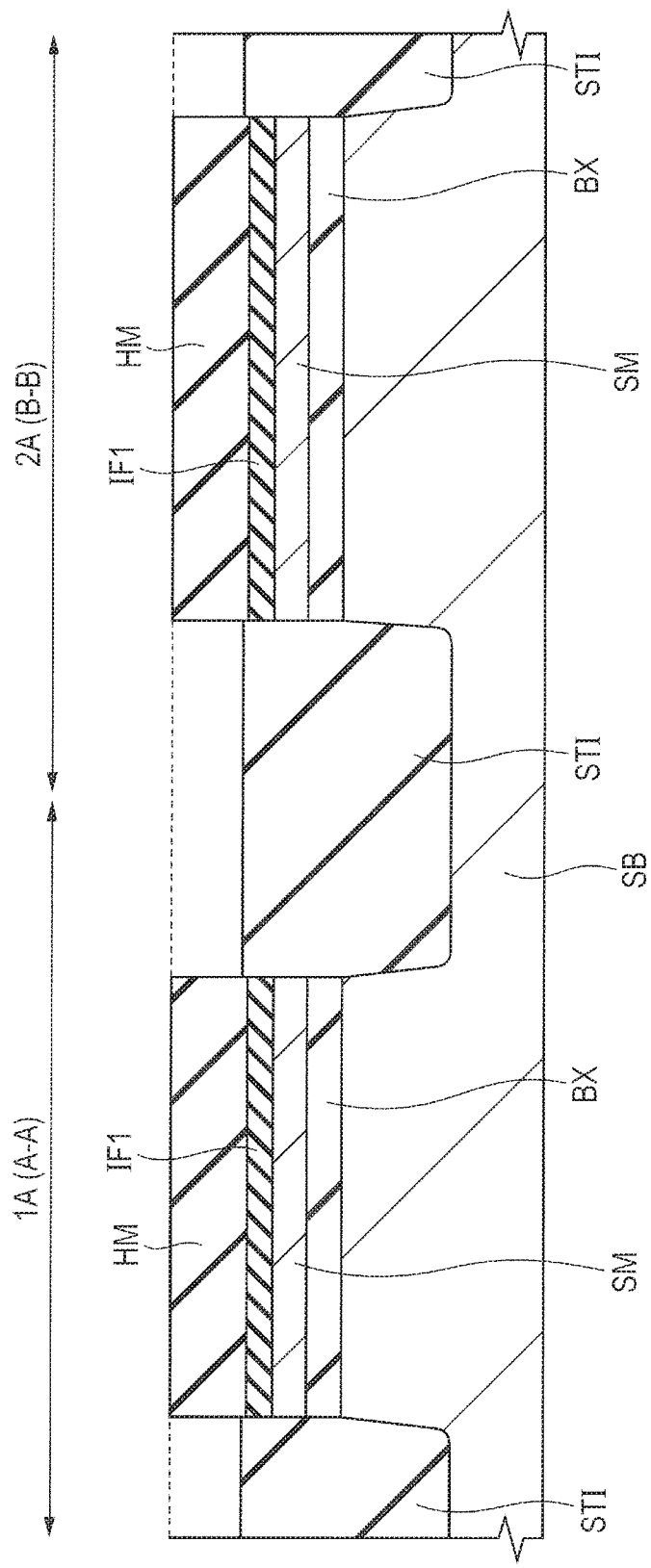
FIG. 7 is a cross-sectional view showing the manufacturing process of the semiconductor device following FIG. 6.

FIG. 7 shows the process of forming the element isolation portion ST1.

At first, a resist pattern is selectively formed on the hard mask HM (not illustrated), according to the photolithography, and each part of the hard mask HM, the insulating film IF1, the semiconductor layer SM, the insulating layer BX, and the semiconductor substrate SB is removed with the resist pattern used as a mask, hence to form a trench on the SOI substrate. Next, the resist pattern is removed according to the asking. A thin silicon oxide film is formed on the side surface and the bottom surface of the trench, according to the thermal oxidation. Next, an insulating film, for example, made of silicon oxide film is piled up on the thin silicon oxide film within the trench and the hard mask HM, for example, according to the CVD. Next, according to the Chemical Mechanical Polishing (CMP), the insulating film is polished, to remove the insulating film outside of the trench, and the insulating film is filled within the trench. As mentioned above, the element isolation portion ST1 is formed penetrating the semiconductor layer SM and the insulating layer BX with its bottom positioned in the semiconductor substrate SB. In FIG. 7, the surface position of the element isolation portion ST1 at the point of finishing the polishing according to the above CMP is shown by a dashed line. Upon completion of the above polishing, as shown in FIG. 7, each part of the semiconductor layer SM, the insulating layer BX, and the semiconductor substrate SB is covered with the element isolation portion ST1. Specifically, each side surface (end portion) of the semiconductor layer SM, the insulating layer BX, and the semiconductor substrate SB is covered with the element isolation portion ST1.

In the state with the region other than the element isolation portion ST1 covered with the hard mask HM, wet etching is performed on the surface of the element isolation portion ST1, for example, by the water solution containing hydrofluoric acid. According to this, the surface of the element isolation portion ST1 is recessed. In FIG. 7, the surface position of the element isolation portion ST1 at the point of finishing the above wet etching is shown by a solid line.

Figure 8:
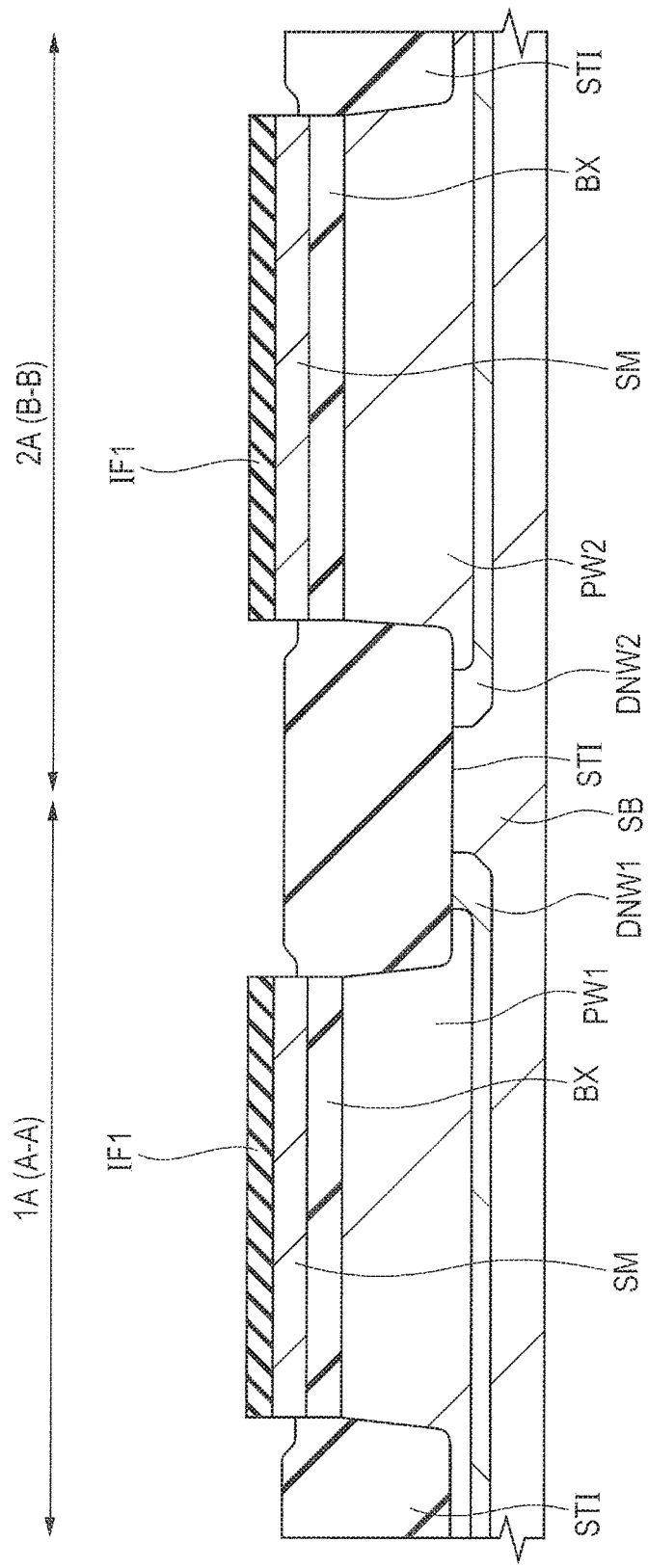
FIG. 8 is a cross-sectional view showing the manufacturing process of the semiconductor device following FIG. 7.

FIG. 8 shows the process of forming the n-type well region DNW1, the p-type well region PW1, the n-type well region DNW2, and the p-type well region PW2.

At first, the hard mask HM shown in FIG. 7 is removed, for example, by the water solution containing phosphoric acid. Next, according to the photolithography and the ion implantation, the n-type well region DNW1 and the p-type well region PW1 are sequentially formed in the area 1A. The p-type ground plane region having a higher impurity concentration than that of the well region PW1 is formed on the surface of the well region PW1; however, the ground plane region is not illustrated here. Next, according to the photolithography and the ion implantation, the n-type well region DNW2 and the p-type well region PW2 are sequentially formed in the area 2A.

In the ion implantation process, the resist pattern is removed and by the cleaning thereafter, the surface of the element isolation portion ST1 is etched.

Figure 9:
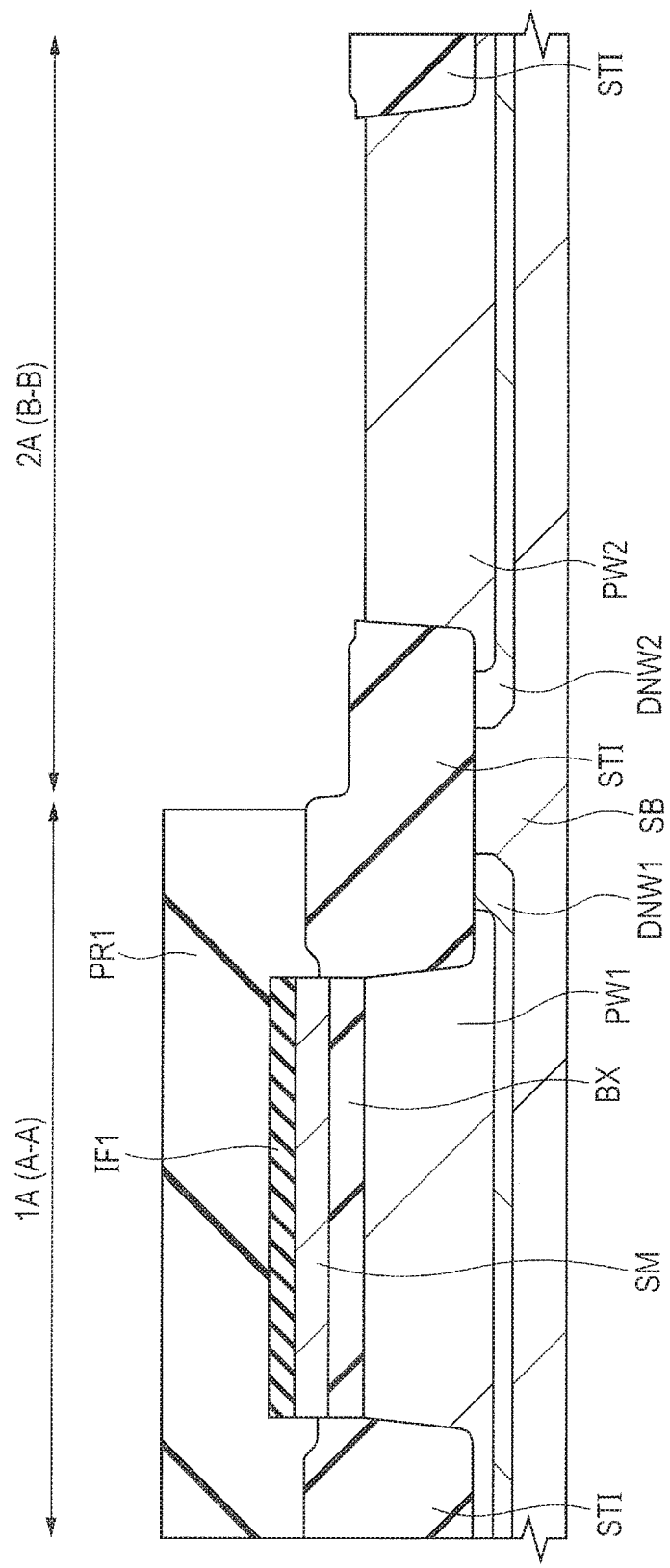
FIG. 9 is a cross-sectional view showing the manufacturing process of the semiconductor device following FIG. 8.

FIG. 9 shows the process of removing the insulating film IF1, the semiconductor layer SM, and the insulating layer BX in the area 2A.

At first, a resist pattern PR1 for covering the area 1A and opening the area 2A is formed. Next, with the resist pattern PR1 as a mask, the etching process is performed, hence to sequentially remove the insulating film IF1, the semiconductor layer SM, and the insulating layer BX in the area 2A. Then, ion implantation for adjusting the threshold of the MISFET 2Tr is performed on the semiconductor substrate SB in the area 2A, according to the photolithography and the ion implantation. The ion implantation for adjusting the threshold of the MISFET 2Tr may be performed through the insulating layer BX after the process of removing the semiconductor layer SM in the area 2A and before the process of removing the insulating layer BX in the area 2A. Thereafter, the resist pattern PR1 is removed by the asking processing.

Further, in the process of removing the insulating film IF1 and the insulating layer BX, the water solution containing hydrofluoric acid is used. Therefore, also the surface of the element isolation portion ST1 is recessed by the above hydrofluoric acid. The surface of the element isolation portion ST1 in the area 2A after each process of FIG. 9 is recessed to the position nearest to the surface of the semiconductor substrate SB in the area 2A.

Figure 10:
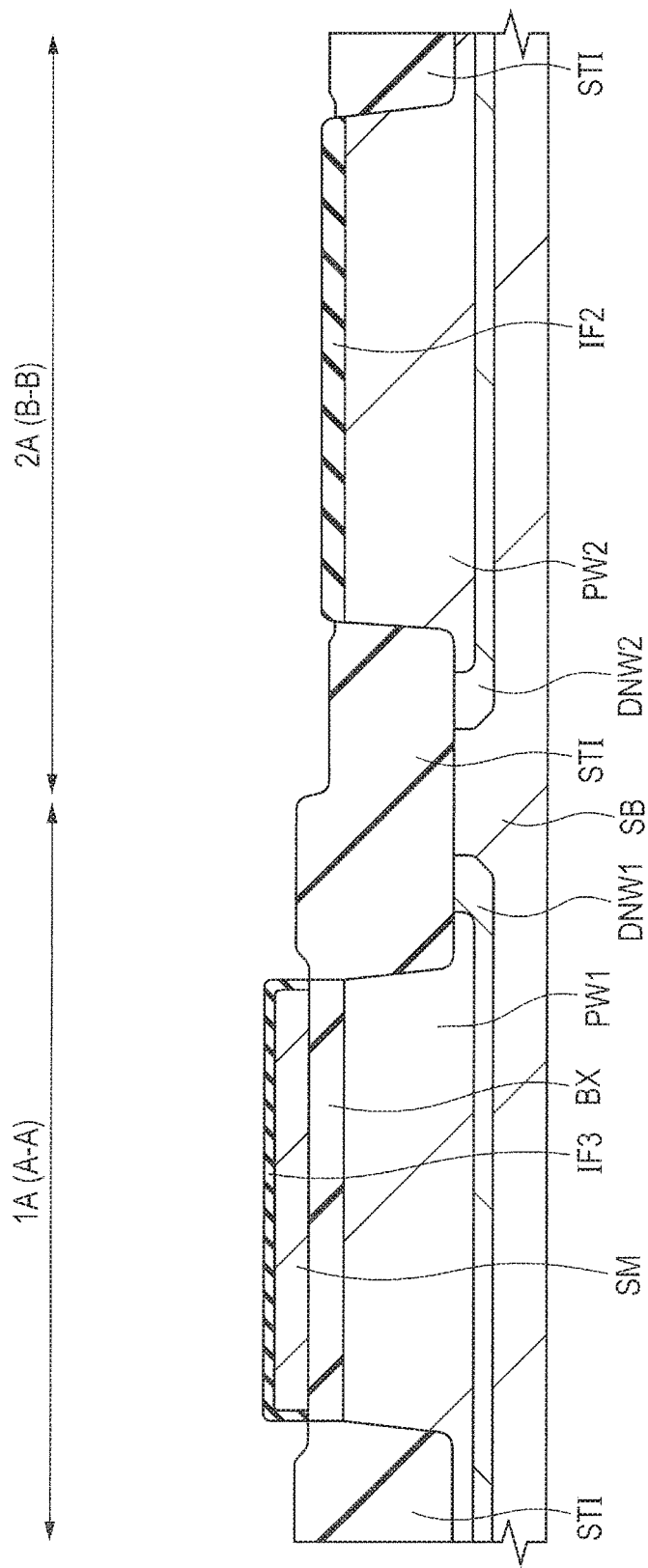
FIG. 10 is a cross-sectional view showing the manufacturing process of the semiconductor device following FIG. 9.

FIG. 10 shows the process of removing the insulating film IF1 in the area 1A and the process of forming the insulating film IF2 and the insulating film IF3.

At first, the insulating film IF2, for example, made of silicon oxide film is formed on the semiconductor substrate SB in the area 2A, for example, according to the thermal oxidation. The thickness of the insulating film IF2 is about 5 to 8 nm. Here, the semiconductor layer SM in the area 1A is also oxidized, to increase the thickness of the insulating film IF1. According to the photolithography and the wet etching, the insulating film IF1 in the area 1A is selectively removed, hence to bare the semiconductor layer SM in the area 1A. The insulating film IF3, for example, made of silicon oxide film is formed on the semiconductor layer SM in the area 1A, for example, according to the thermal oxidation. The thickness of the insulating film IF2 is about 2 to 3 nm. Here, the semiconductor substrate SB in the area 2A is also oxidized, to increase the thickness of the insulating film IF2. The insulating film IF2 and the insulating film IF3 formed as mentioned above become the gate insulating film GF2 and the gate insulating film GF1 respectively in the later process.

A high dielectric constant film made of metal oxide film such as hafnium oxide may be formed on the insulating film IF2 and the insulating film IF3. In this case, the gate insulating film GF2 is formed by the insulating film IF2 and the high dielectric constant film and the gate insulating film GF1 is formed by the insulating film IF3 and the high dielectric constant film.

Further, in the process of removing the insulating film IF1, the water solution containing hydrofluoric acid is used. Therefore, the surface of the element isolation portion ST1 in the area 1A is also recessed mainly by the hydrofluoric acid. As the result, the surface of the element isolation portion ST1 in the area 1A after each process of FIG. 10 is further recessed compared to that after the process of FIG. 9.

Figure 11:
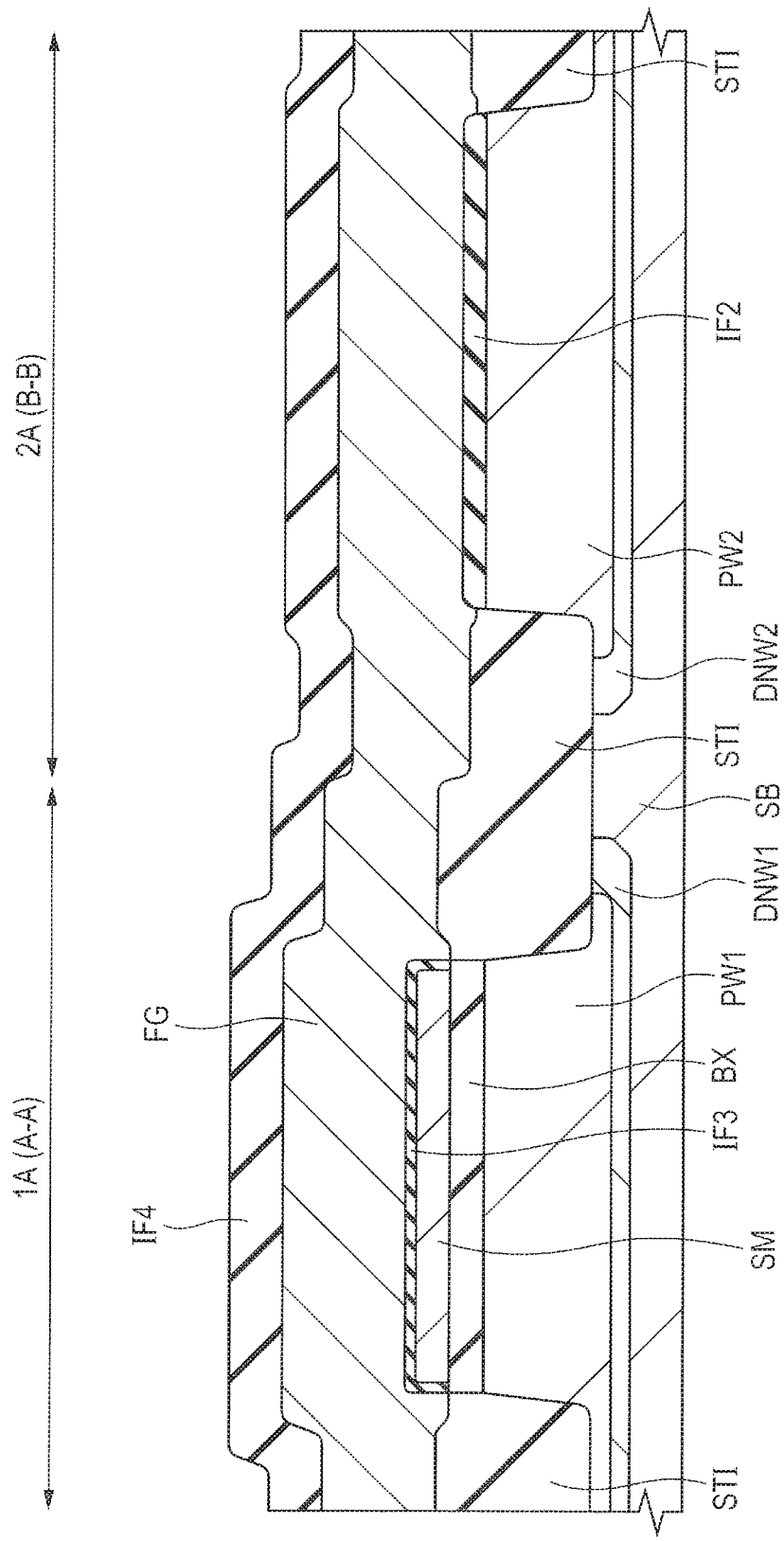
FIG. 11 is a cross-sectional view showing the manufacturing process of the semiconductor device following FIG. 10.

FIG. 11 shows the process of forming the conductive film FG and the insulating film IF4.

To cover the area 1A and the area 2A, the conductive film FG for gate electrode is formed. The conductive film FG is formed, for example, according to the CVD and made of, for example, polycrystalline silicon film. The thickness of the conductive film is about 60 to 100 nm. Then, the n-type impurity is introduced to the conductive film FG according to the photolithography and the ion implantation. The conductive film forming each gate electrode is not restricted to a polycrystalline silicon film but may be a metal film or a film stack of a polycrystalline silicon film and a metal film.

Next, the insulating film IF4 for a cap film is formed on the conductive film FG. The insulating film IF4 is formed, for example, according to the CVD, and made of, for example, a silicon nitride film. The thickness of the insulating film IF4 is about 30 to 100 nm. Although it will be described later, the thickness of the insulating film IF4 is preferably thicker than the thickness for the recessed surface of the element isolation portion ST1 in the process of forming the trench TR.

Figure 12:
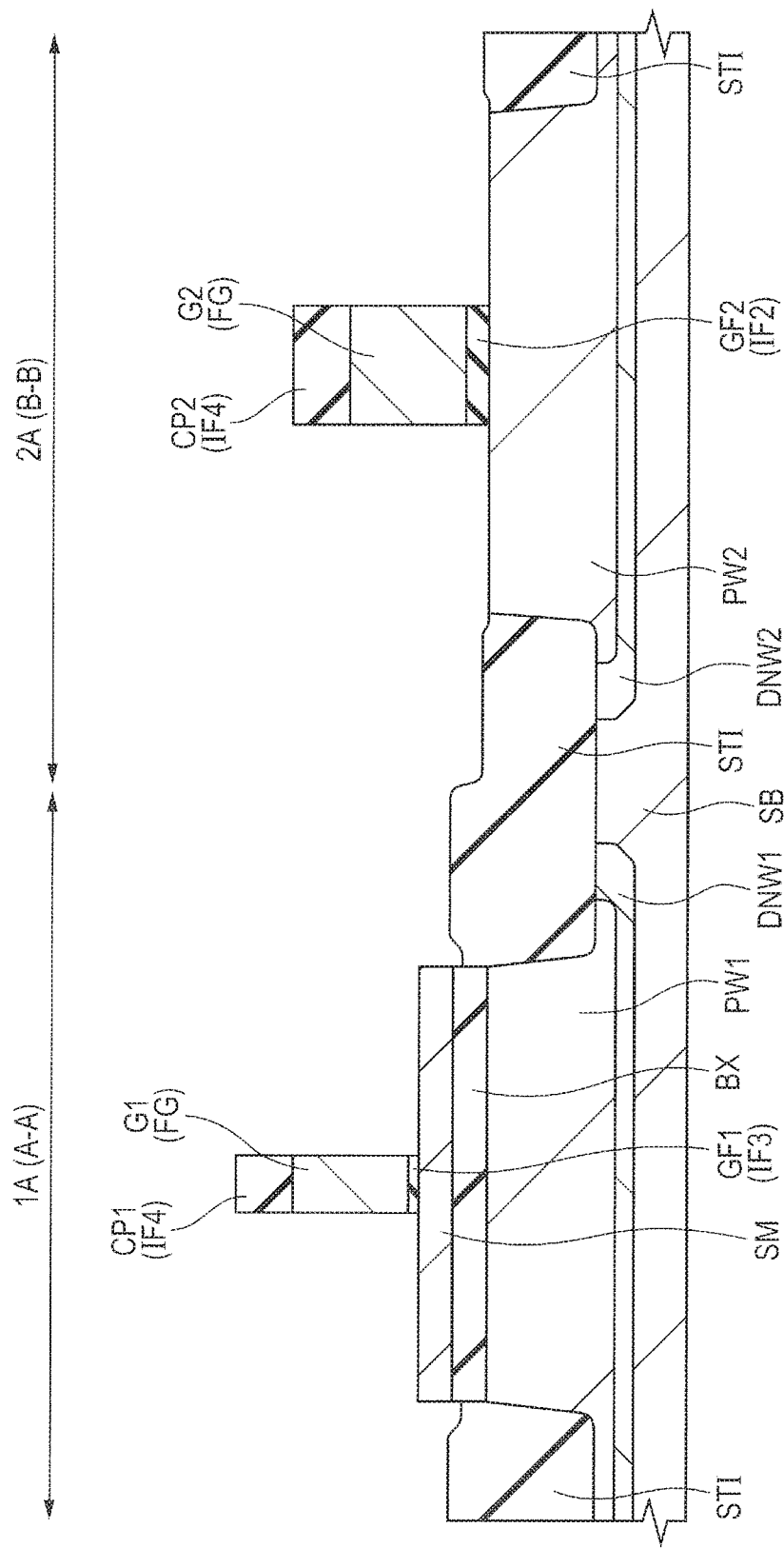
FIG. 12 is a cross-sectional view showing the manufacturing process of the semiconductor device following FIG. 11.

FIG. 12 shows the process of forming the gate insulating film GF1, the gate insulating film GF2, the gate electrode G1, the gate electrode G2, a cap film CP1, and a cap film CP2.

The insulating film IF4 and the conductive film FG are patterned in the area 1A and the area 2A, according to the photolithography and the dry etching. According to this, the gate electrode G1 and the cap film CP1 positioned on the gate electrode G1 are formed on the semiconductor layer SM in the area 1A and the gate electrode G2 and the cap film CP2 formed on the gate electrode G2 are formed on the semiconductor substrate SB in the area 2A. Then, the insulating film IF3 bared from the gate electrode G1 in the area 1A and the insulating film IF2 bared from the gate electrode G2 in the area 2A are removed according to the wet etching. Thus, the gate insulating film GF1 is formed under the gate electrode G1 in the area 1A and the gate insulating film GF2 is formed under the gate electrode G2 in the area 2A.

In the process of removing the insulating film IF2 and the insulating film IF3, the water solution containing hydrofluoric acid is used. Therefore, the surface of the element isolation portion ST1 in the area 1A and the area 2A is also recessed mainly by the hydrofluoric acid. As the result, the surface of the element isolation portion ST1 in the area 1A and the area 2A after each process of FIG. 12 is further recessed than after the process of FIG. 11.

Figure 13:
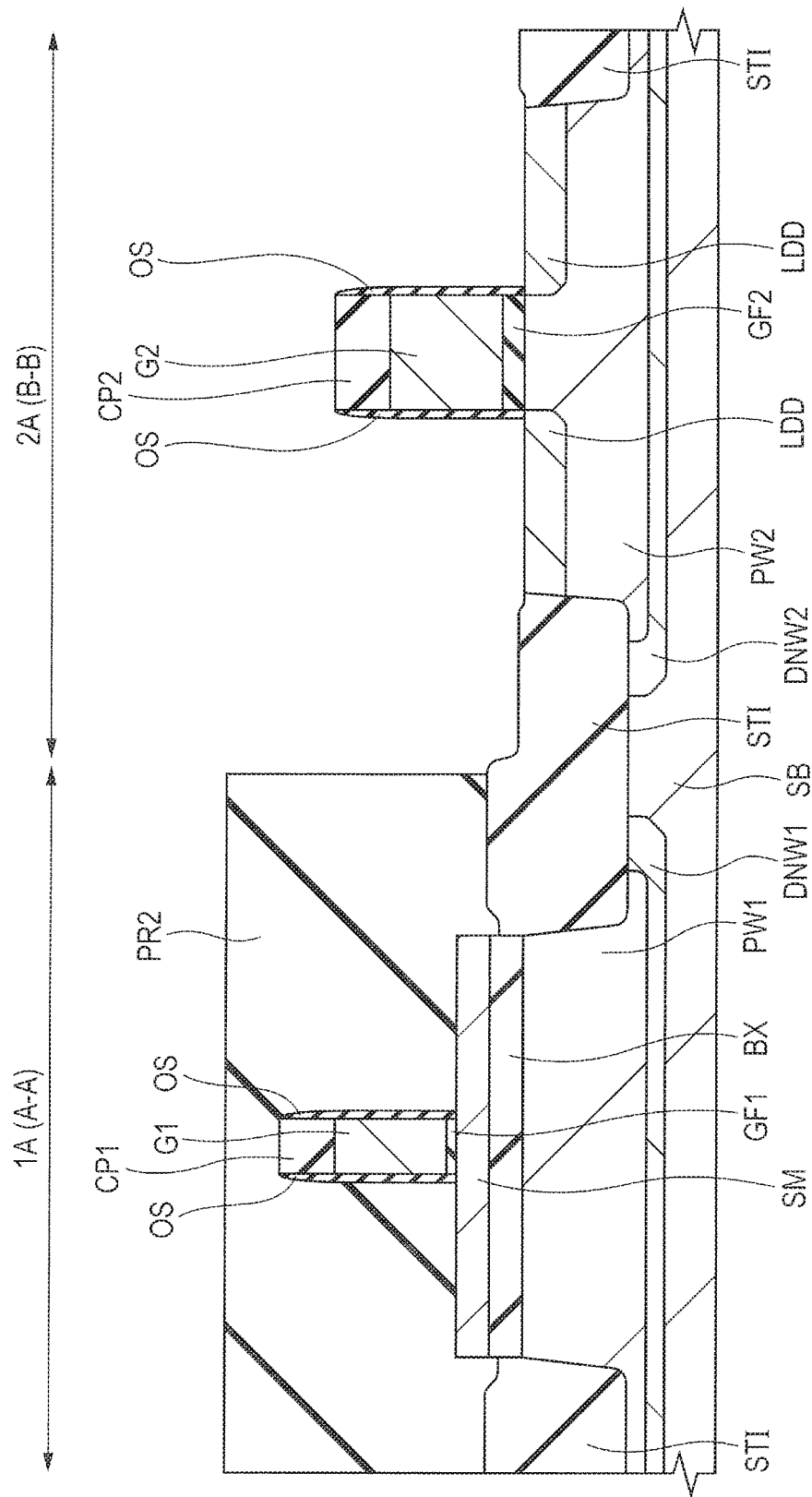
FIG. 13 is a cross-sectional view showing the manufacturing process of the semiconductor device following FIG. 12.

FIG. 13 shows the process of forming the offset spacer OS and the impurity region LDD.

The insulating film, for example, made of silicon oxide film is formed to cover the area 1A and the area 2A, for example, according to the CVD. Next, by performing the anisotropy etching on this insulating film, the offset spacer OS is formed on the respective side surfaces of the gate electrode G1 and the gate electrode G2. The length of the offset spacer OS is about 5 nm.

A resist pattern PR2 is formed to cover the area 1A and open the area 2A. Next, with the resist pattern PR2 used as a mask, ion implantation is performed to form the n-type impurity region LDD on the semiconductor substrate SB in the area 2A. Then, the resist pattern PR2 is removed by the asking processing.

Figure 14:
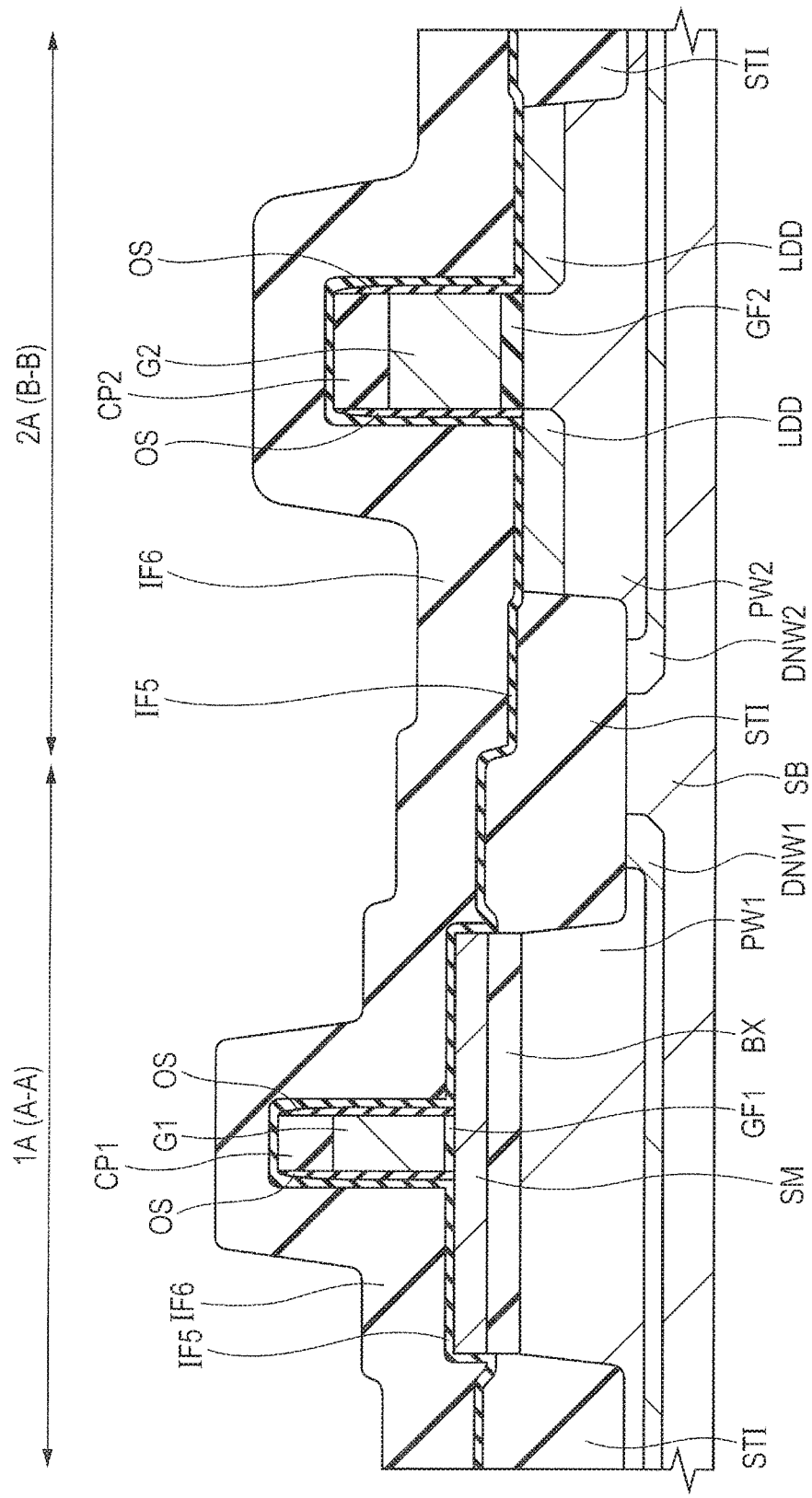
FIG. 14 is a cross-sectional view showing the manufacturing process of the semiconductor device following FIG. 13.

FIG. 14 shows the process of forming the insulating film IF5 and the insulating film IF6.

The insulating film IF5, for example, made of silicon oxide film is formed to cover the area 1A and the area 2A, for example, according to the CVD. The thickness of the insulating film IF5 is, for example, about 5 nm. According to this, in the area 1A, the insulating film IF5 is formed on the top surface and the side surface of the gate electrode G1 and on the semiconductor layer SM, and in the area 2A, the insulating film IF5 is formed on the top surface and the side surface of the gate electrode G2 and on the semiconductor substrate SB. The insulating film IF6, for example, made of silicon nitride film is formed on the insulating film IF5, for example, according to the CVD.

Figure 15:
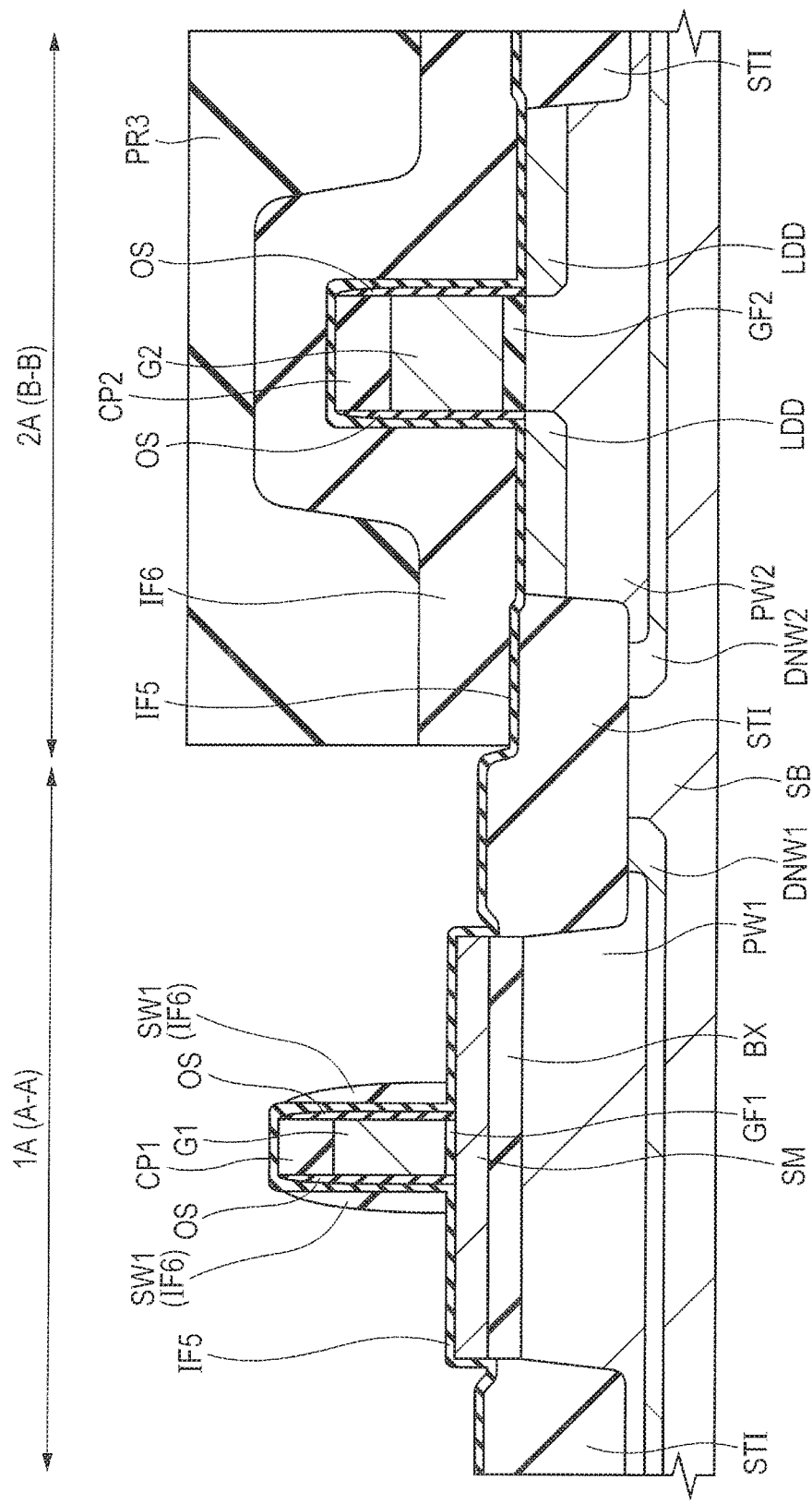
FIG. 15 is a cross-sectional view showing the manufacturing process of the semiconductor device following FIG. 14.

FIG. 15 shows the process of forming the sidewall spacer SW1.

A resist pattern PR3 is formed to cover the area 2A and open the area 1A. In the area 2A, the resist pattern PR3 is formed across not only on the semiconductor substrate SB but also on the element isolation portion ST1. With the resist pattern PR3 used as a mask, anisotropy etching is performed on the insulating film IF6 in the area 1A and the insulating film IF6 in the area 1A is processed, to form the sidewall spacer SW1 on the side surface of the gate electrode G1 through the offset spacer OS and the insulating film IF5. Here, the insulating film IF5 works as the etching stopper. Then, the resist pattern PR3 is removed by the asking processing and the like.

Figure 16:
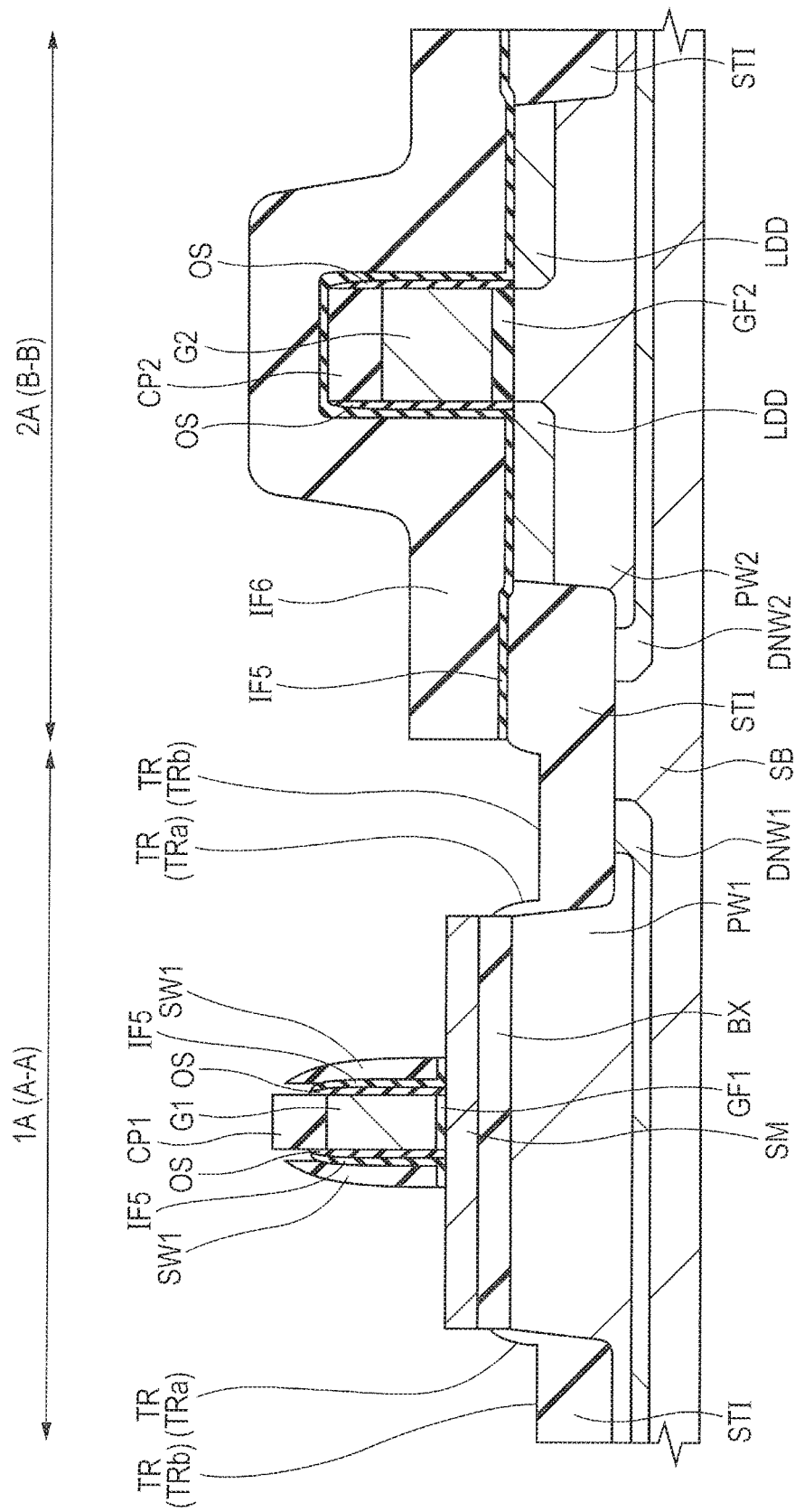
FIG. 16 is a cross-sectional view showing the manufacturing process of the semiconductor device following FIG. 15.

FIG. 16 shows the process of removing the insulating film IF5 in the area 1A and the process of forming the trench TR.

With the area 2A covered with the insulating film IF6, the wet etching or dry etching is performed on the insulating film IF5 in the area 1A. According to this, in the area 1A, the insulating film IF5 bared from the sidewall spacer SW1 is removed. In other words, the insulating film IF5 is left only between the offset spacer OS and the sidewall spacer SW1 and between the sidewall spacer SW1 and the semiconductor layer SM.

Next, with the area 2A covered with the insulating film IF6, the anisotropy etching is performed on the element isolation portion ST1 in the area 1A. According to this, the element isolation portion ST1 in the area 1A is selectively etched, and the trench TR is formed within the element isolation portion ST1. At the time of forming the trench TR, the cap film CP1, the sidewall spacer SW1, and the semiconductor layer SM in the area 1A and the insulating film IF6 in the area 2A work as the etching stopper film. Therefore, it is not necessary to provide an additional mask at the time of forming the trench TR; therefore, the manufacturing cost can be suppressed.

Further, the depth of the trench TR is preferably deeper than the boundary between the semiconductor layer SM and the insulating layer BX in the area 1A, and more preferably, further deeper than the boundary between the insulating layer BX and the semiconductor substrate SB in the area 1A. In other words, the lowest part of the bottom TRb of the trench TR is lower than the surface of the semiconductor substrate SB and lower than the surface of the element isolation portion ST1 in the area 2A. Specifically, the thickness of the element isolation portion ST1 removed for forming the trench TR is about 30 to 50 nm. By setting the depth of the trench TR as mentioned above, the height for forming the sidewall spacer SW5 described later can be fully secured.

In the area 2A, the insulating film IF6 is formed across not only on the semiconductor substrate SB but also on the element isolation portion ST1; as the result, the boundary portion between the semiconductor substrate SB and the element isolation portion ST1 in the area 2A is covered with the insulating film IF6. Accordingly, the element isolation portion ST1 in the area 2A is never recessed through the formation of the trench TR. If the element isolation portion ST1 in the area 2A is recessed to the deep position deeper than the impurity region LDD and the diffusion region D2 described later, the semiconductor substrate SB in the area 2A and the diffusion region D2 are short-circuited through the silicide layer SI when forming the silicide layer SI described later. In the embodiment, since the boundary portion between the semiconductor substrate SB in the area 2A and the element isolation portion ST1 is covered with the insulating film IF6, the above disadvantage can be suppressed.

Hereinafter, an advantage of using the anisotropy etching such as dry etching, without using the isotropic etching such as wet etching, at the time of forming the trench TR, will be described.

When using the isotropic etching at the time of forming the trench TR, there is a fear of removing not only the element isolation portion ST1 but also the insulating layer BX. The end portion of the insulating layer BX is recessed inwardly further than the end portion of the semiconductor layer SM and there is a fear of generating a space between the semiconductor layer SM and the semiconductor substrate SB. When there remains a foreign substance or moisture in the space during the manufacturing process, the insulating performance between the semiconductor layer SM and the semiconductor substrate SB is degraded, which may cause a conductive defect. On the contrary, at the time of forming the trench TR, when using the anisotropy etching, the insulating layer BX is hardly recessed, hence to improve the reliability of the semiconductor device.

Next, another advantage of using the anisotropy etching will be described. As shown in FIG. 16, the lateral side TRa of the trench TR is formed by a part of the element isolation portion ST1 left in a spacer shape. The side surface of the semiconductor substrate SB is not bared from the element isolation portion ST1 but covered with a part of the element isolation portion ST1. Accordingly, in the next process of FIG. 17, when performing the epitaxial growth method, the epitaxial layer EP grows from the side surface of the semiconductor substrate SB and this grown epitaxial layer EP can avoid short-circuit of the semiconductor substrate SB and the semiconductor layer SM that becomes the source region or drain region.

It is preferable that a part of the element isolation portion ST1 forming the lateral side TRa of the trench TR covers not only the side surface of the semiconductor substrate SB but also the side surface of the insulating layer BX.

A further another advantage of using the anisotropy etching will be described later.

At the time of forming the trench TR, the offset spacer OS and the insulating film IF5 made of the same material as the silicon oxide film forming the isolation portion ST1 are also affected by the etching. Here, when performing the isotropic etching, a portion formed between the sidewall spacer SW1 and the semiconductor layer SM, of the insulating film IF5, is recessed; while, when performing the anisotropy etching, the above portion is hardly recessed. Accordingly, at the time of forming the trench TR, the anisotropy etching is desirable.

Of the insulating film IF5, however, the portion formed between the offset spacer OS and the sidewall spacer SW1 and the offset spacer OS formed on the side surface of the gate electrode G1 are recessed affected by the etching in any case of the isotropic etching and the anisotropy etching. In short, the offset spacer OS and the insulating film IF5 are recessed in a film thickness direction. Actually, since the space between the gate electrode G1 and the sidewall spacer SW1 is narrow, the film thickness for the recessed offset spacer OS and insulating film IF5 is smaller than that of the recessed element isolation portion ST1. When the offset spacer OS and the insulating film IF5 are recessed more than the thickness of the cap film CP1, the side surface of the gate electrode G1 is bared. In the next process of FIG. 17, when performing the epitaxial growth method, there is a fear that the epitaxial layer EP grows from the side surface of the gate electrode G1.

In the embodiment, the thickness of the cap film CP1 is set at the depth of the trench TR and more. In other words, the thickness of the cap film CP1 is set at the thickness of the etched element isolation portion ST1 and the more. According to this, at the time of forming the trench TR, even when the offset spacer OS and the insulating film IF5 are recessed, it is possible to avoid the side surface of the gate electrode G1 from being bared.

Generally considering the above, in the embodiment, the etching at the time of forming the trench TR is performed by the anisotropy etching. This can improve the reliability of the semiconductor device.

Figure 17:
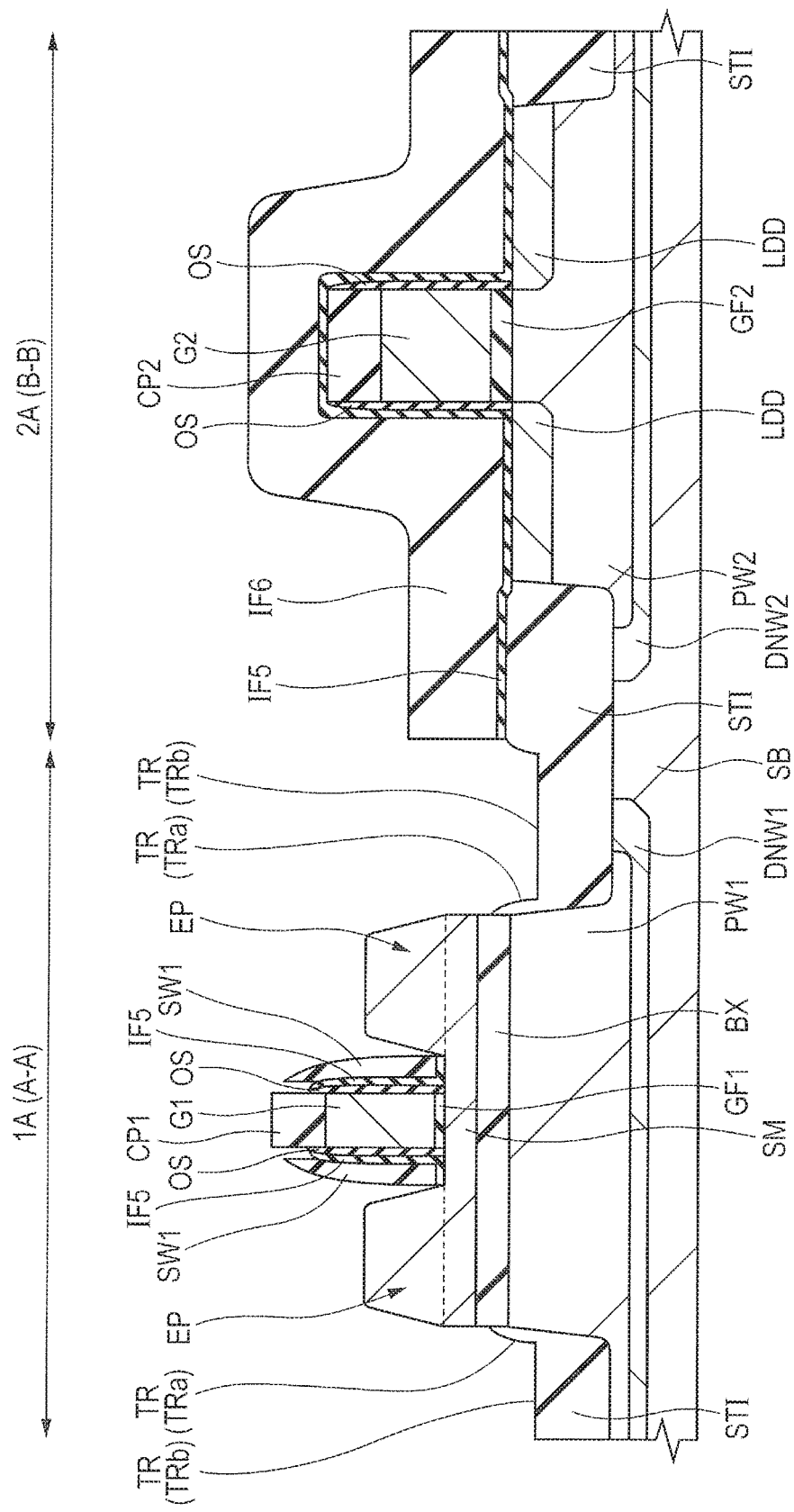
FIG. 17 is a cross-sectional view showing the manufacturing process of the semiconductor device following FIG. 16.

FIG. 17 is the manufacturing process following FIG. 16, showing the process of forming the epitaxial layer EP.

At first, the water solution containing hydrofluoric acid or the water solution containing ammonia is used to clean the surface of the semiconductor layer SM in the area 1A. Then, according to the epitaxial growth method, for example, the epitaxial layer (semiconductor layer) EP made of single crystal silicon is formed on the semiconductor layer SM in the area 1A. The film thickness of the semiconductor layer EP is about 20 nm to 40 nm. Here, the top of the gate electrode G1 in the area 1A is covered with the cap film CP1 and the whole area 2A is covered with the insulating film IF6; therefore, the epitaxial layer EP is not formed there. As mentioned above, the side surface of the semiconductor substrate SB in the lateral side TRa of the trench TR is covered with a part of the element isolation portion ST1 and the side surface of the gate electrode G1 is covered with the offset spacer OS and the insulating film IF5; therefore, the epitaxial layer EP is not formed there.

The epitaxial layer EP is integrated with the semiconductor layer SM because of being made of the same material; however, in the embodiment, for the sake of easy understanding of the invention, the epitaxial layer EP is indicated by an arrow and the boundary between the epitaxial layer EP and the semiconductor layer SM is indicated by a dashed line.

Figure 18:
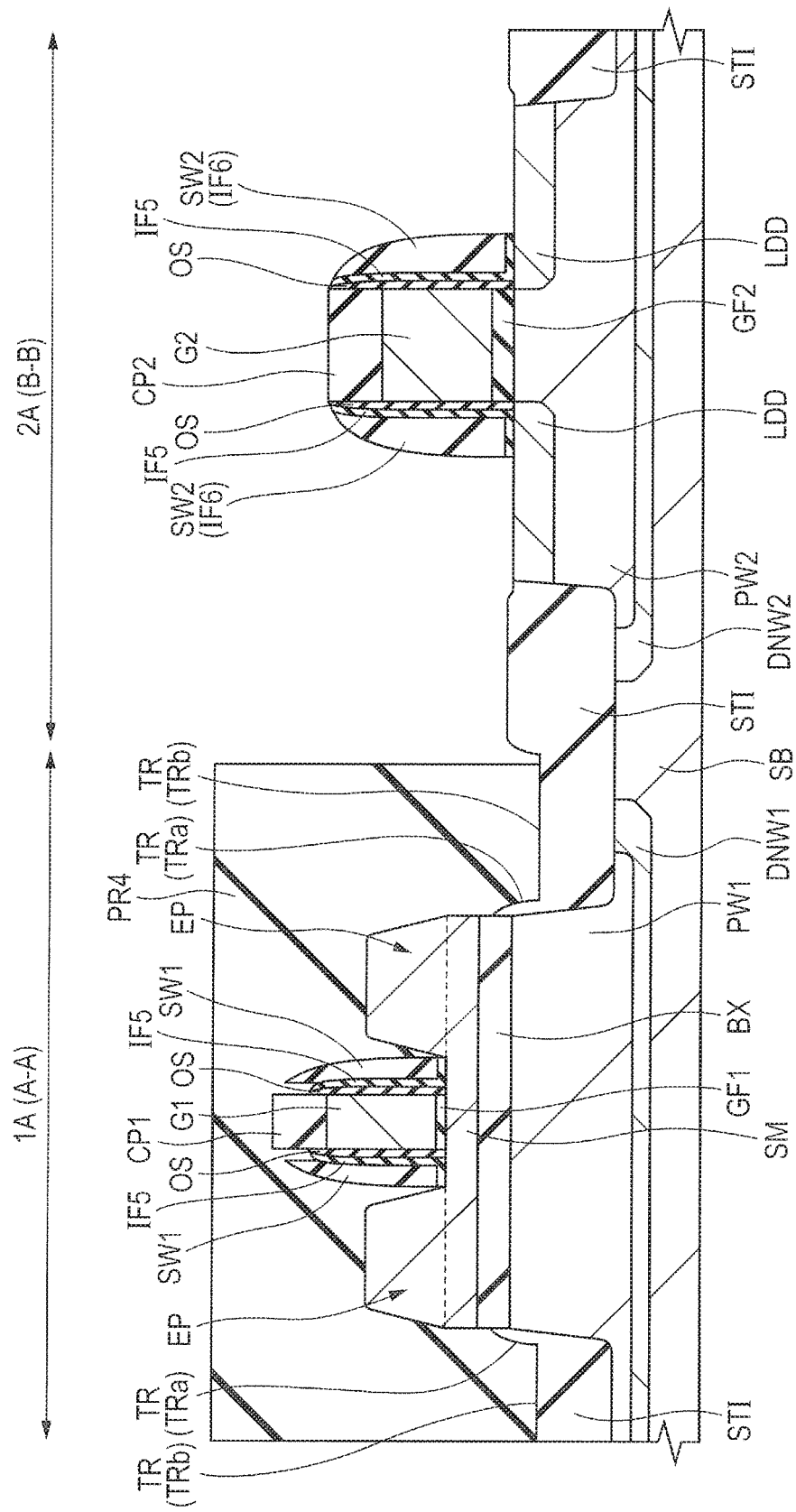
FIG. 18 is a cross-sectional view showing the manufacturing process of the semiconductor device following FIG. 17.

FIG. 18 shows the process of forming the sidewall spacer SW2 in the area 2A and the process of removing the insulating film IF5.

A resist pattern PR4 is formed to cover the area 1A and open the area 2A. Next, by performing the anisotropy etching with the resist pattern PR4 used as a mask, the insulating film IF6 in the area 2A is processed and the sidewall spacer SW2 is formed on the side surface of the gate electrode G2 through the insulating film IF5. Here, the insulating film IF5 works as the etching stopper.

Next, the dry etching or the wet etching is performed on the insulating film IF5 in the area 2A. This removes the insulating film IF5 formed on the top surface of the gate electrode G2, the top surface of the sidewall spacer SW2, and the semiconductor substrate SB bared from the sidewall spacer SW2, in the area 2A. In short, the insulating film IF5 remains only between the offset spacer OS and the sidewall spacer SW2 and between the sidewall spacer SW2 and the semiconductor substrate SB. Thereafter, the resist pattern PR4 is removed by the asking processing.

Figure 19:
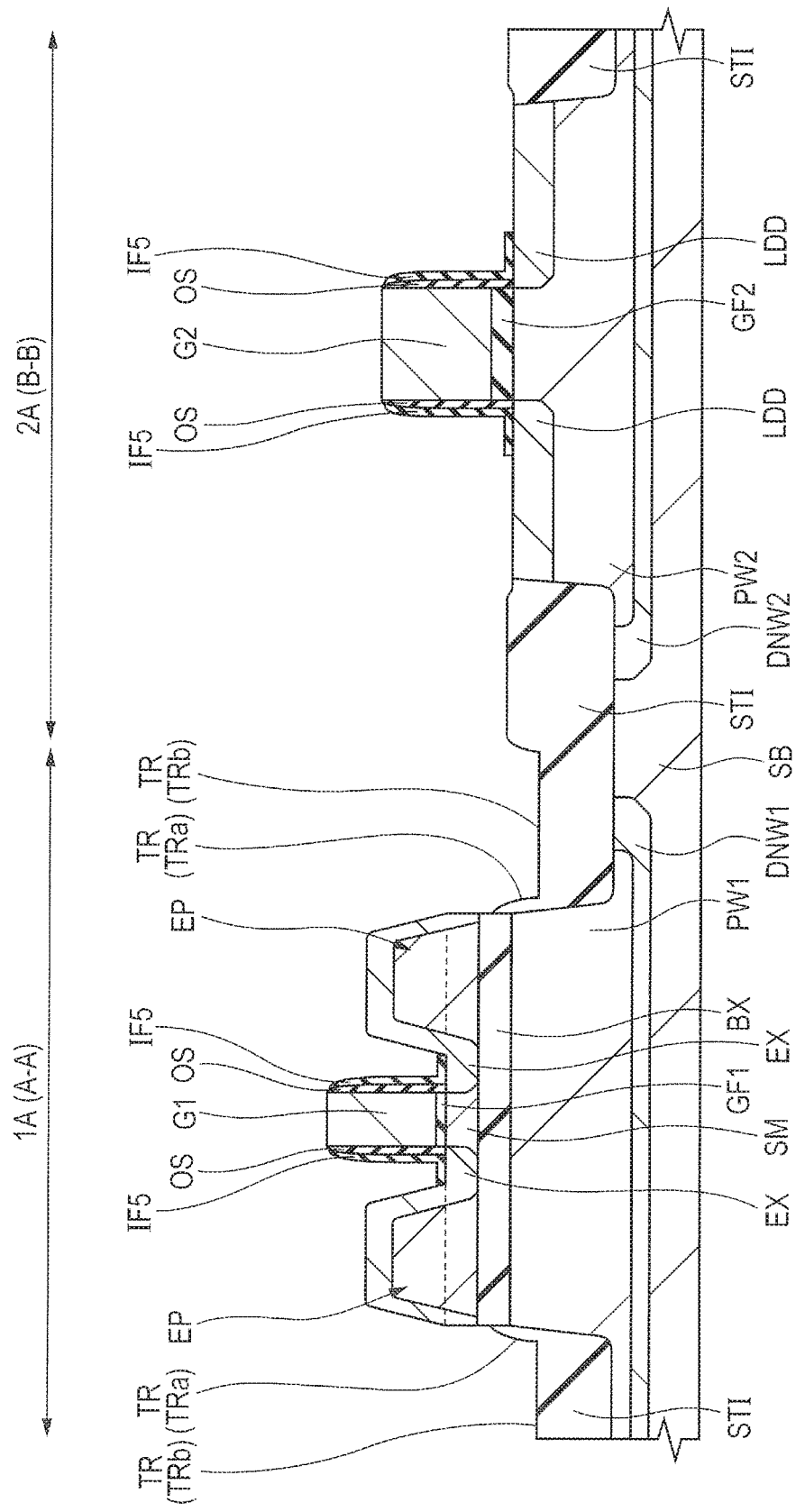
FIG. 19 is a cross-sectional view showing the manufacturing process of the semiconductor device following FIG. 18.

FIG. 19 shows the process of removing the sidewall spacer SW1, the sidewall spacer SW2, the cap film CP1, and the cap film CP2 and the process of forming the extension region EX.

By performing the etching process under the condition of hardly removing the element isolation portion ST1, the offset spacer OS, and the insulating film IF5, the sidewall spacer SW1 and the cap film CP1 in the area 1A and the sidewall spacer SW2 and cap film CP2 in the area 2A are removed. Further, the sidewall spacer SW1, the sidewall spacer SW2, the cap film CP1, and the cap film CP2 are formed of the same material, and these can be removed at once. As the result, it is not necessary to add a mask, hence to simplify the manufacturing process.

According to the photolithography and the ion implantation, the n-type extension region (impurity region) EX is selectively formed in the semiconductor layer SM and the epitaxial layer EP on the both sides of the gate electrode G1 in the area 1A. The extension region EX forms a part of the source region or the drain region of the MISFET 1Tr.

Figure 20:
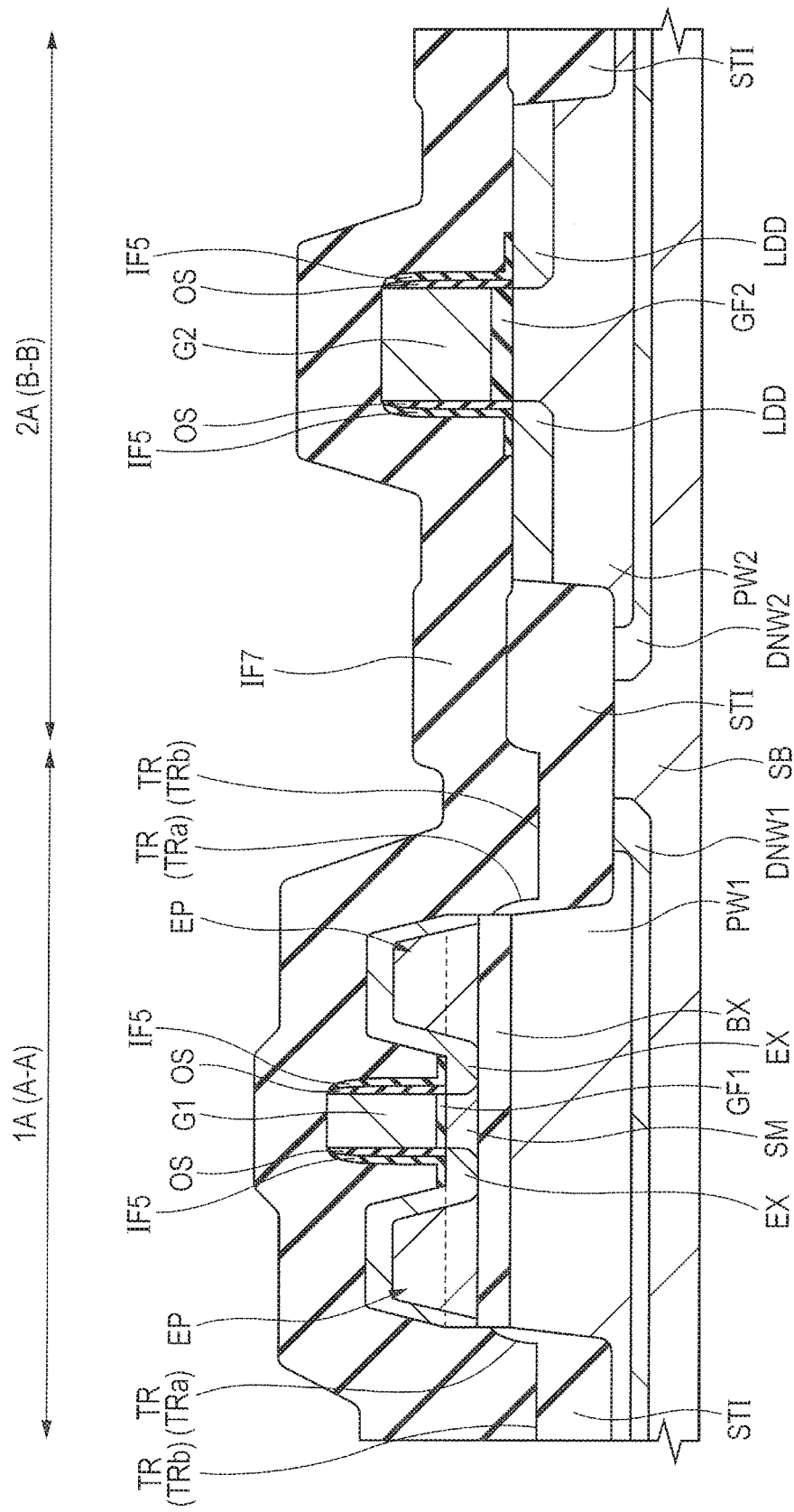
FIG. 20 is a cross-sectional view showing the manufacturing process of the semiconductor device following FIG. 19.

FIG. 20 shows the process of forming the insulating film IF7.

The insulating film IF7 is an insulating film for the sidewalls SW3 to SW5 in the next process, which is formed by depositing, for example, a silicon nitride film so as to cover the area 1A and the area 2A, for example, according to the CVD.

Figure 21:
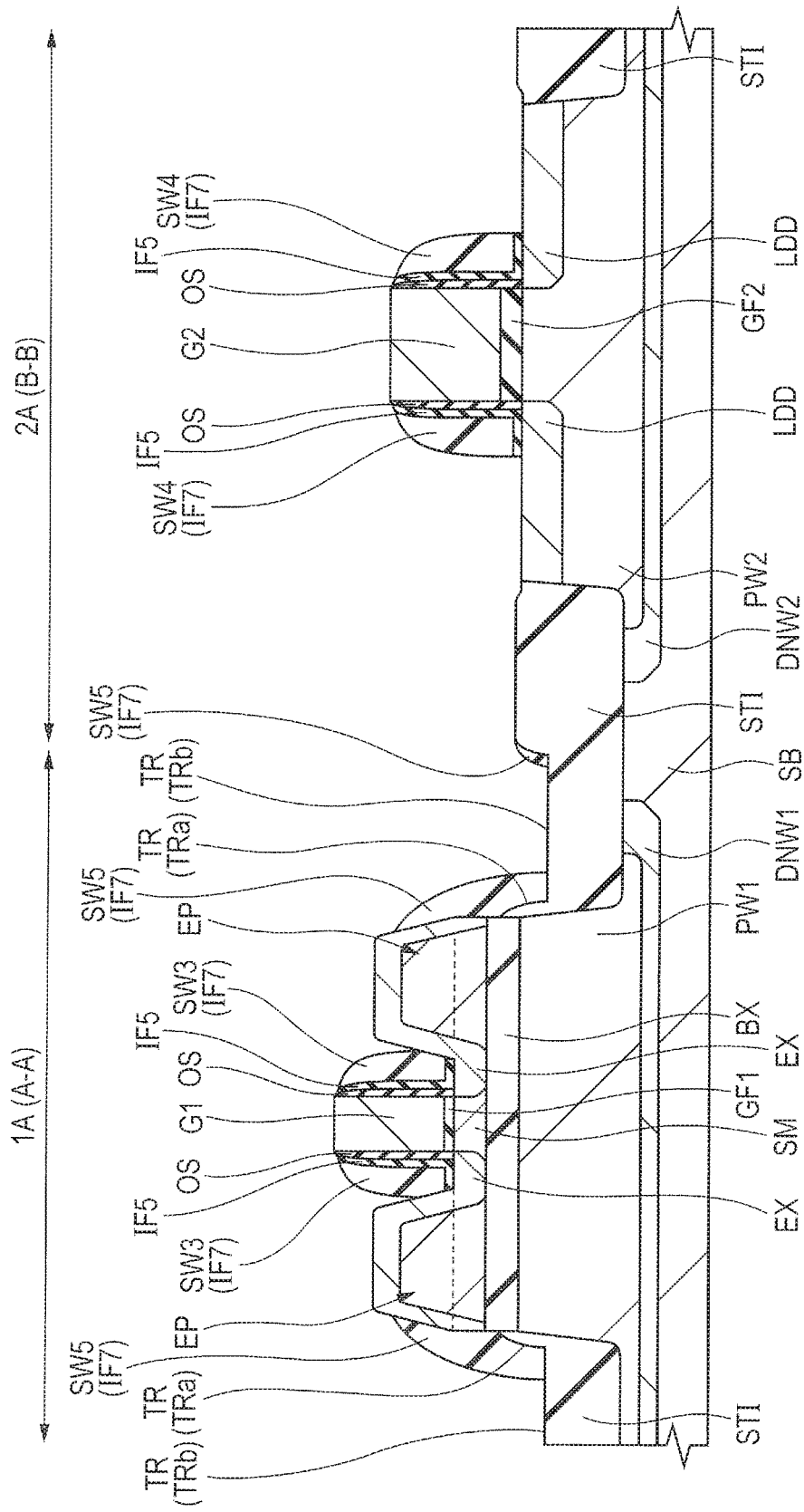
FIG. 21 is a cross-sectional view showing the manufacturing process of the semiconductor device following FIG. 20.

FIG. 21 shows the process of forming the sidewalls SW3 to SW5.

By performing the anisotropy etching on the insulating film IF7, the sidewall spacer SW3 and the sidewall spacer SW4 are formed on the respective side surfaces of the gate electrode G1 and the gate electrode G2 through the offset spacer OS and the insulating film IF5. Here, in the area 1A, the sidewall spacer SW5 is formed on the lateral side TRa of the trench TR. The sidewall spacer SW5 is formed to cover the side surfaces of the epitaxial layer EP, the semiconductor layer SM, the insulating layer BX, and the semiconductor substrate SB. Here, it is important that the sidewall spacer SW5 covers at least the side surface of the insulating layer BX and the side surface of the semiconductor substrate SB. Further, as mentioned above, the side surface of the semiconductor substrate SB is covered with a part of the element isolation portion ST1. Therefore, the sidewall spacer SW5 covers the side surface of the semiconductor substrate SB through a part of the element isolation portion ST1. As mentioned above, since the trench TR is formed in the element isolation portion ST1, the height of the sidewall spacer SW5 (thickness in a film thickness direction) can be fully secured. Accordingly, when forming the plug PG in the later process, even when a deviation occurs in the plug PG, it is possible to avoid from conducting the semiconductor layer SM that becomes the source region or the drain region with the semiconductor substrate SB. As the result, the reliability of the semiconductor device can be improved.

The upmost end portion of the sidewall spacer SW5 is preferably positioned upper than the boundary between the insulating layer BX and the semiconductor substrate SB, more preferably upper than the boundary between the semiconductor layer SM and the insulating layer BX, and further preferably upper than the boundary between the epitaxial layer EP and the semiconductor layer SM. Further, the lowermost end portion of the sidewall spacer SW5 is preferably positioned below the boundary between the semiconductor layer SM and the insulating layer BX.

The end portion of the sidewall spacer SW3 formed on the side surface of the gate electrode G1 is positioned above the epitaxial layer EP. According to this, when forming the silicide layer SI in the later process, the silicide layer SI can be suppressed from growing to arrive at the semiconductor layer SM under the gate electrode G1.

Figure 22:
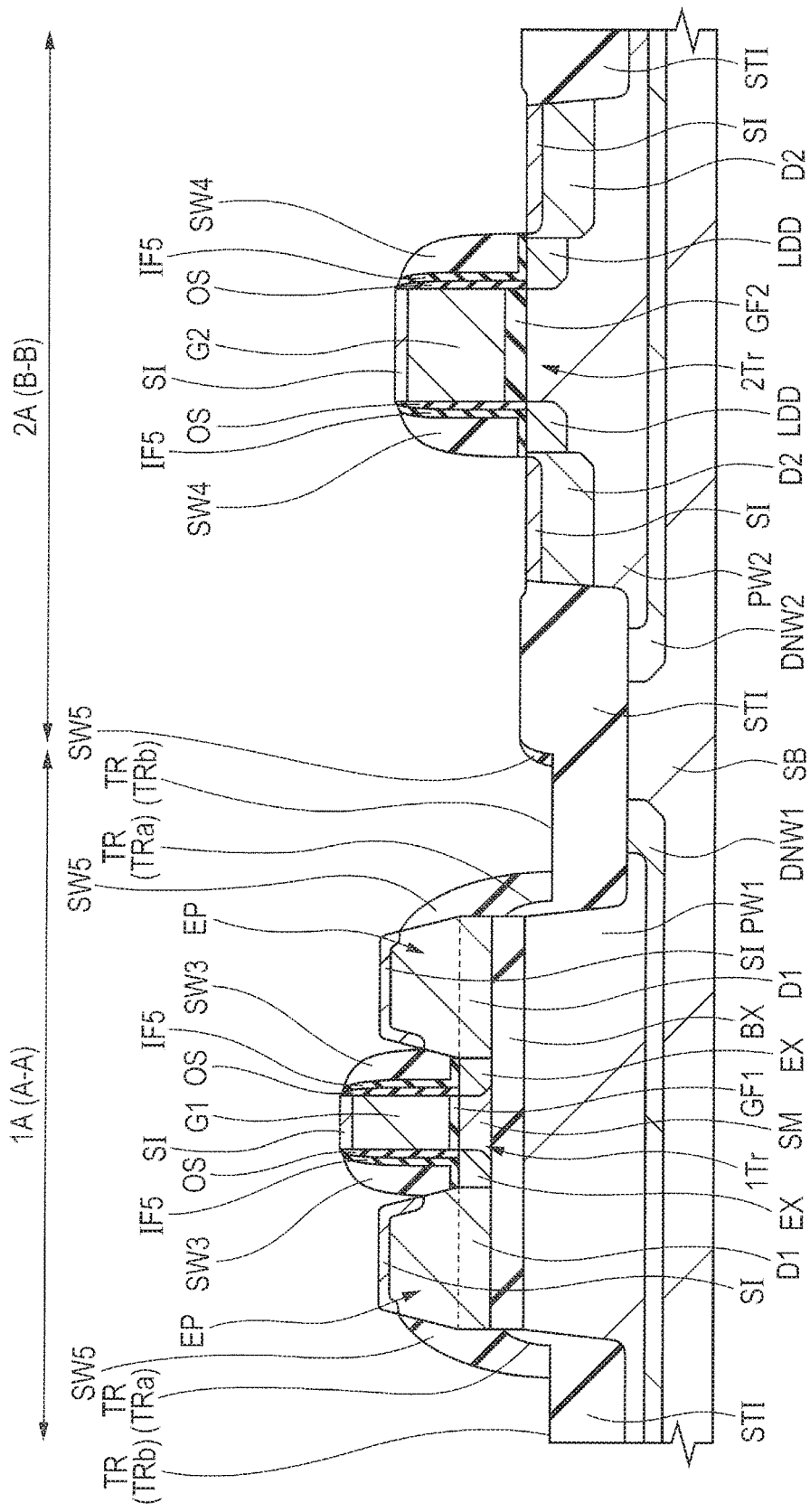
FIG. 22 is a cross-sectional view showing the manufacturing process of the semiconductor device following FIG. 21.

FIG. 22 shows the process of forming the diffusion region D1, the diffusion region D2, and the silicide layer SI.

According to the photolithography and the ion implantation, the n-type diffusion region (impurity region) D1 is formed in the epitaxial layer EP and the semiconductor layer SM in the area 1A, and the n-type diffusion region (impurity region) D2 is formed in the semiconductor substrate SB in the area 2A.

In the area 1A, the n-type diffusion region D1 has a higher impurity concentration than the extension region EX and is coupled to the extension region EX, hence to form apart of the source region or the drain region in the MISFET 1Tr.

In the area 2A, the n-type diffusion region D2 has a higher impurity concentration than the impurity region LDD and is coupled to the impurity region LDD, hence to form apart of the source region or the drain region in the MISFET 2Tr.

For the purpose of activating the impurity included in the extension region EX, the impurity region LDD, the diffusion region D1, and the diffusion region D2, the thermal processing is performed on the semiconductor substrate SB with a temperature of about 1050° C.

Next, according to the Salicide (Self Aligned Silicide) technology, the silicide layer SI of low resistance is formed on the respective top surfaces of the diffusion region D1, the diffusion region D2, the gate electrode G1, and the gate electrode G2.

The silicide layer SI is formed specifically in the following way. To cover the area 1A and the area 2A, a metal film for forming the silicide layer SI is formed. The metal film is made of, for example, cobalt, nickel, or nickel platinum alloy. Next, first thermal processing is performed on the semiconductor substrate SB with a temperature of about 300 to 400° C., and then, second thermal processing is performed with a temperature of about 600 to 700° C. to make the diffusion region D1, the diffusion region D2, the gate electrode G1, and the gate electrode G2 react with the metal film. According to this, the silicide layer SI is formed on the respective top surfaces of the diffusion region D1, the diffusion region D2, the gate electrode G1, and the gate electrode G2. Then, the unreacted metal film is removed.

In the embodiment, the silicide layer SI in the area 1A is formed on the bared region from the sidewall spacer SW3 and the sidewall spacer SW5 of the epitaxial layer EP. As mentioned above, by positioning the end portion of the sidewall spacer SW3 upper than the epitaxial layer EP, the silicide layer SI can be avoided from excessively growing to arrive at the semiconductor layer SM under the gate electrode G1. Further, by positioning the upmost end portion of the sidewall spacer SW5 at a position in contact with the semiconductor layer SM or a position in contact with the epitaxial layer EP, the silicide layer SI can be avoided from excessively growing from the semiconductor layer SM toward the semiconductor substrate SB. As the result, the reliability of the semiconductor device can be improved.

As mentioned above, the MISFET 1Tr is formed in the area 1A and the MISFET 2Tr is formed in the area 2A.

Figure 23:
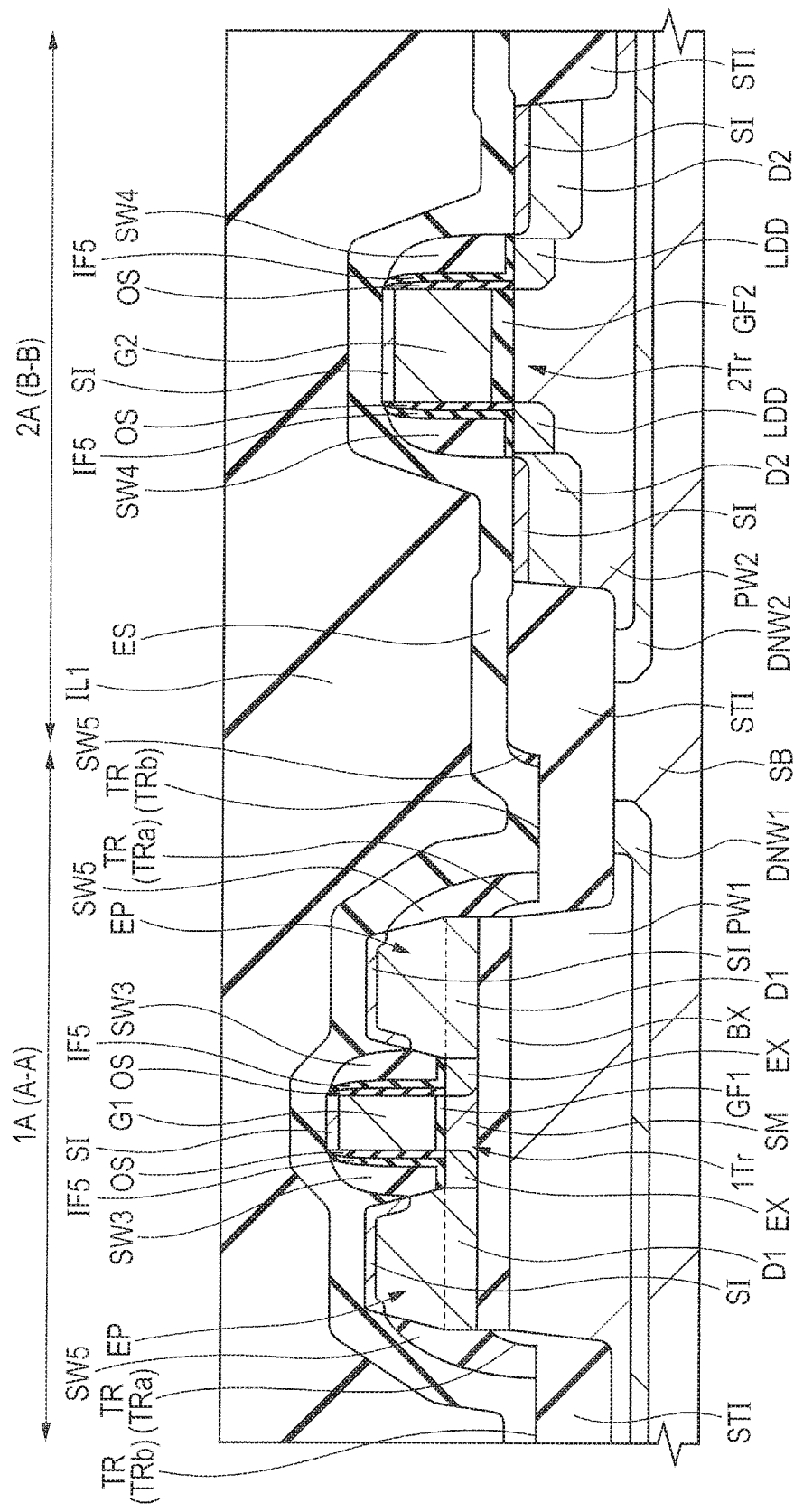
FIG. 23 is a cross-sectional view showing the manufacturing process of the semiconductor device following FIG. 22.

FIG. 23 shows the process of forming the etching stopper film ES and the interlayer insulating film IL1.

The etching stopper film (insulating film) ES, for example, made of silicon nitride film is formed to cover the area 1A and the area 2A, for example, according to the CVD. The material of forming the etching stopper film ES is different from the material of forming the interlayer insulating film IL1 and the element isolation portion ST1. Next, the interlayer insulating film IL1, for example, made of silicon oxide film is formed on the etching stopper film ES, for example, according to the CVD. Then, depending on the necessity, the top surface of the interlayer insulating film IL1 may be polished according to the CMP.

Figure 24:
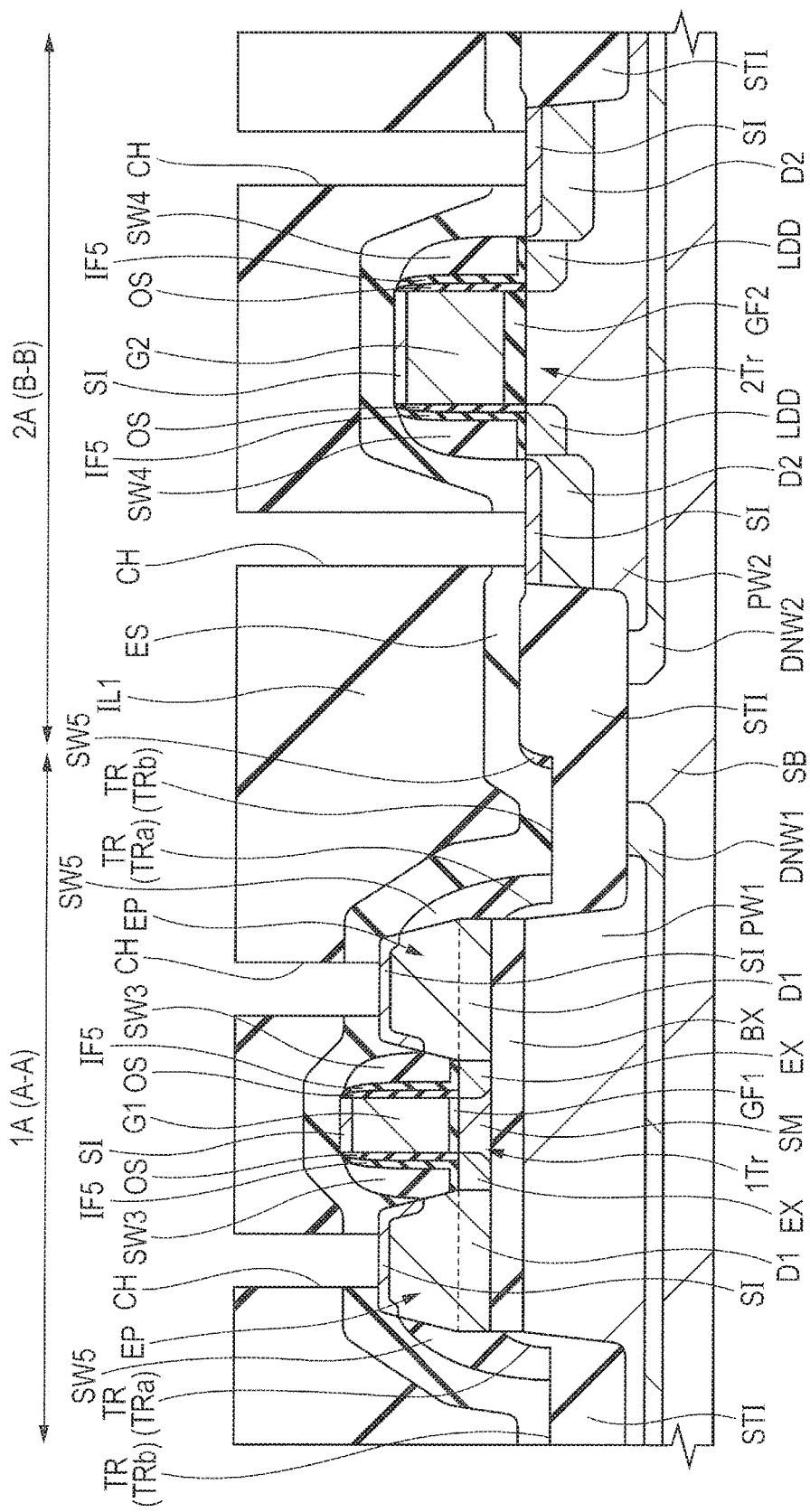
FIG. 24 is a cross-sectional view showing the manufacturing process of the semiconductor device following FIG. 23.

FIG. 24 shows the process of forming the contact hole CH.

The interlayer insulating film IL1 is etched to bare the etching stopper film ES, according to the photolithography and the dry etching, under the condition of hardly removing the etching stopper film ES. Then, gas of the dry etching is changed and the etching stopper film ES is removed, hence to form the contact hole CH. Here, the etching stopper film ES is over-etched to surely open the contact hole CH.

When the position of the contact hole CH is deviated according to the mask deviation as shown in FIG. 4, the contact hole CH arrives at the sidewall spacer SW5. Then, since the sidewall spacer SW5 is formed by the same material of the etching stopper film ES, the sidewall spacer SW5 is a little etched. In the embodiment, however, since the height of the sidewall spacer SW5 is fully secured, the bottom of the contact hole CH remains within the sidewall spacer SW5 and hardly arrives at the well region PW1. As the result, the diffusion region D1 is not conducted with the well region PW1.

Even if the overetching is excessive and the contact hole CH penetrates the sidewall spacer SW5, a part of the element isolation portion ST1 is formed in a spacer shape on the side surface of the semiconductor substrate SB and a part of the element isolation portion ST1 works as the etching stopper, hence to avoid the diffusion region D1 from being conducted with the well region PW1.

Following the manufacturing process in FIG. 24, by forming the plug PG and the wiring M1, the semiconductor device according to the embodiment shown in FIGS. 2 and 3 is manufactured.

By filling the contact hole CH with a conductive film mainly made of tungsten (W), a plurality of plugs PG are formed within the interlayer insulating film IL1. The plugs PG formed in the regions are electrically connected to the gate electrode G1, the gate electrode G2, the diffusion region D1, and the diffusion region D2 through the silicide layer SI.

Next, the interlayer insulating film IL2 is formed on the plugs PG embedded interlayer insulating film IL1. Then, after forming a trench for wiring in the interlayer insulating film IL2, a conductive film mainly made of, for example, copper is filled within the wiring trench, hence to form the wiring M1 of coupling with the plug PG, within the interlayer insulating film IL2. The structure of this wiring M1 is called a so-called Damascene wiring structure.

Then, the wiring in the second layer and later is formed according to the Dual Damascene method; here, its description and illustration is omitted. Further, the wiring M1 and the wiring upper than the wiring M1 are formed not only in the Damascene wiring structure but also formed with the conductive film patterned, for example, as the tungsten wiring or aluminum wiring.

As mentioned above, the semiconductor device according to the embodiment is manufactured.

Second Embodiment

Hereinafter, a semiconductor device according to a second embodiment and its manufacturing method will be described using FIGS. 25 to 28. The following description will be made mainly about a different point from the first embodiment.

In the first embodiment, as described in FIG. 16, after removing the insulating film IF5, the anisotropy etching is performed on the element isolation portion ST1 in the area 1A, to form the trench TR within the element isolation portion ST1 in the area 1A.

On the contrary, in the second embodiment, after removing the insulating film IF5, the element isolation portion ST1 in the area 1A is a little etched and after forming the epitaxial layer EP, anisotropy etching is performed on the element isolation portion ST1 in the area 1A, to form the trench TR within the element isolation portion ST1 in the area 1A.

Figure 25:
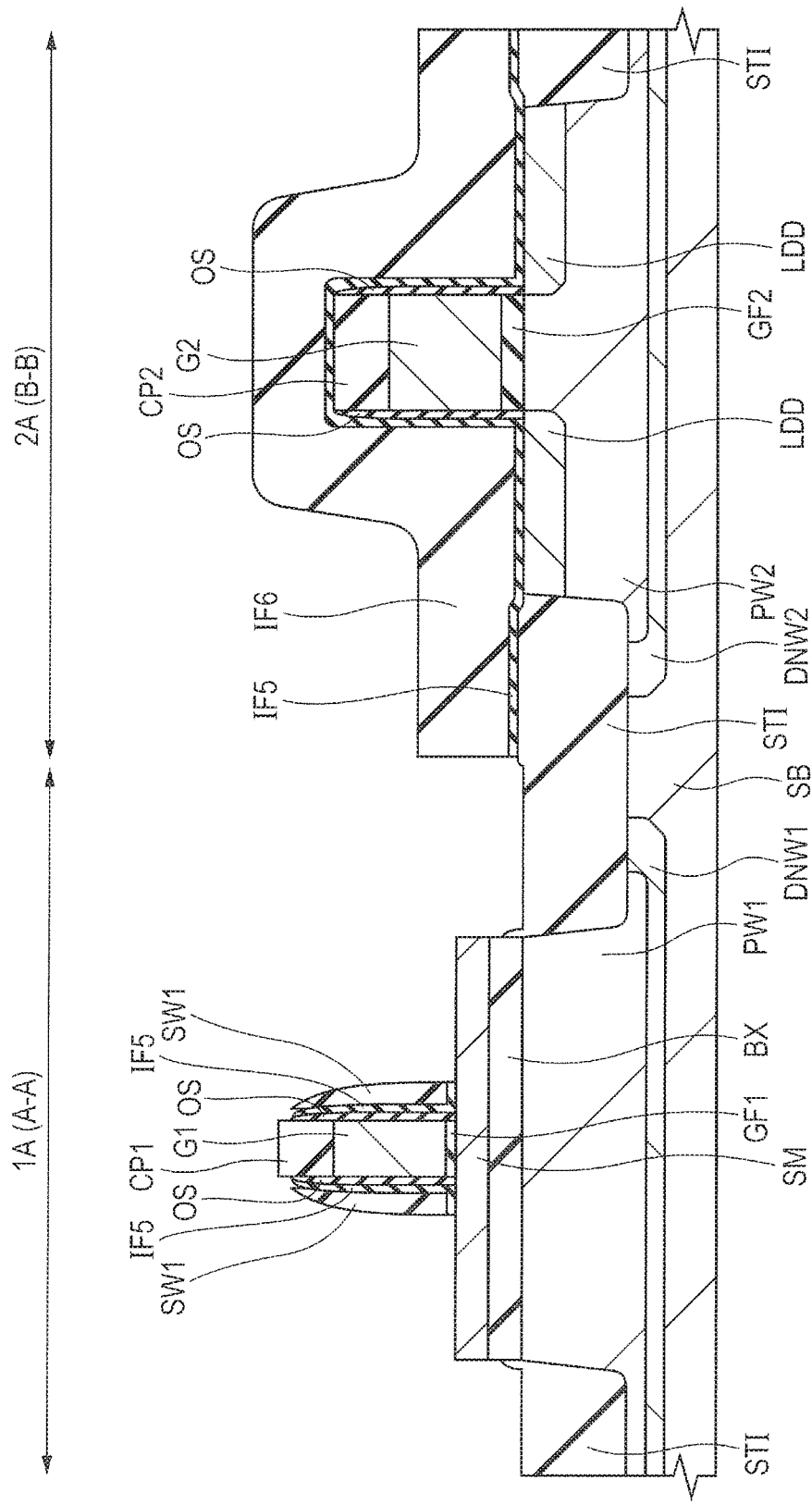
FIG. 25 is a cross-sectional view showing the manufacturing process of a semiconductor device according to a second embodiment.

FIG. 25 shows the manufacturing process following FIG. 15 in the first embodiment.

In FIG. 25, the insulating film IF5 in the area 1A is removed according to the same method as the first embodiment. The surface of the element isolation portion ST1 in the area 1A is recessed according to the anisotropy etching or the isotropic etching. This etching process is performed so as not to bare the semiconductor substrate SB in the area 1A. In other words, even after the etching, the side surface of the semiconductor substrate SB in the area 1A is covered with the element isolation portion ST1.

Because the etching amount of the above etching process is small, the isotropic etching such as wet etching may be used; considering that the side surface of the insulating layer BX is a little recessed, however, the anisotropy etching such as dry etching is preferably used for the above etching.

Figure 26:
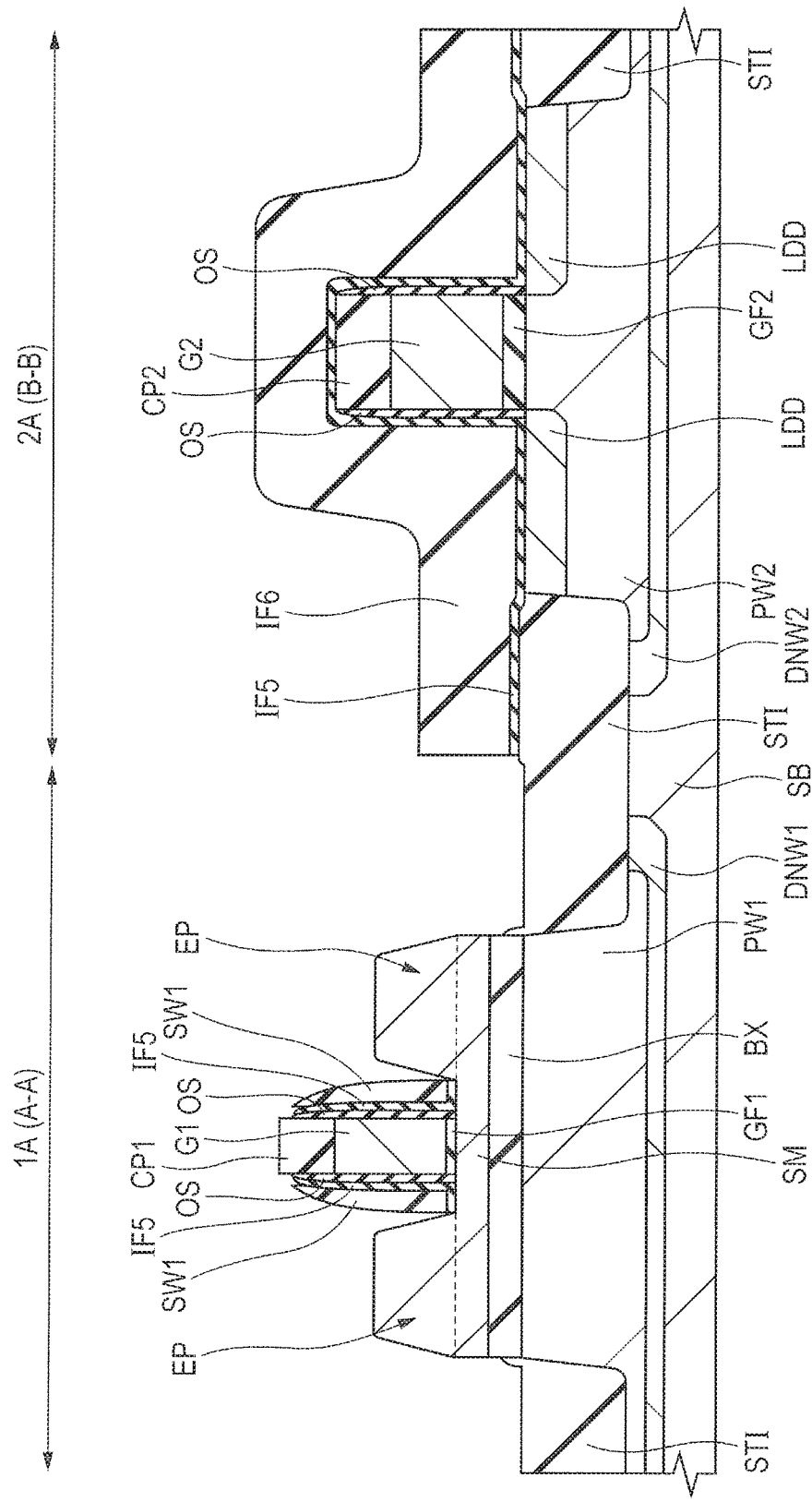
FIG. 26 is a cross-sectional view showing the manufacturing process of the semiconductor device following FIG. 25.

As shown in FIG. 26, according to the same method as the first embodiment, the epitaxial layer EP is formed on the semiconductor layer SM in the area 1A. Here, the side surface of the semiconductor substrate SB in the area 1A is covered with the element isolation portion ST1; therefore, the epitaxial layer EP is not formed on the side surface of the semiconductor substrate SB.

Figure 27:
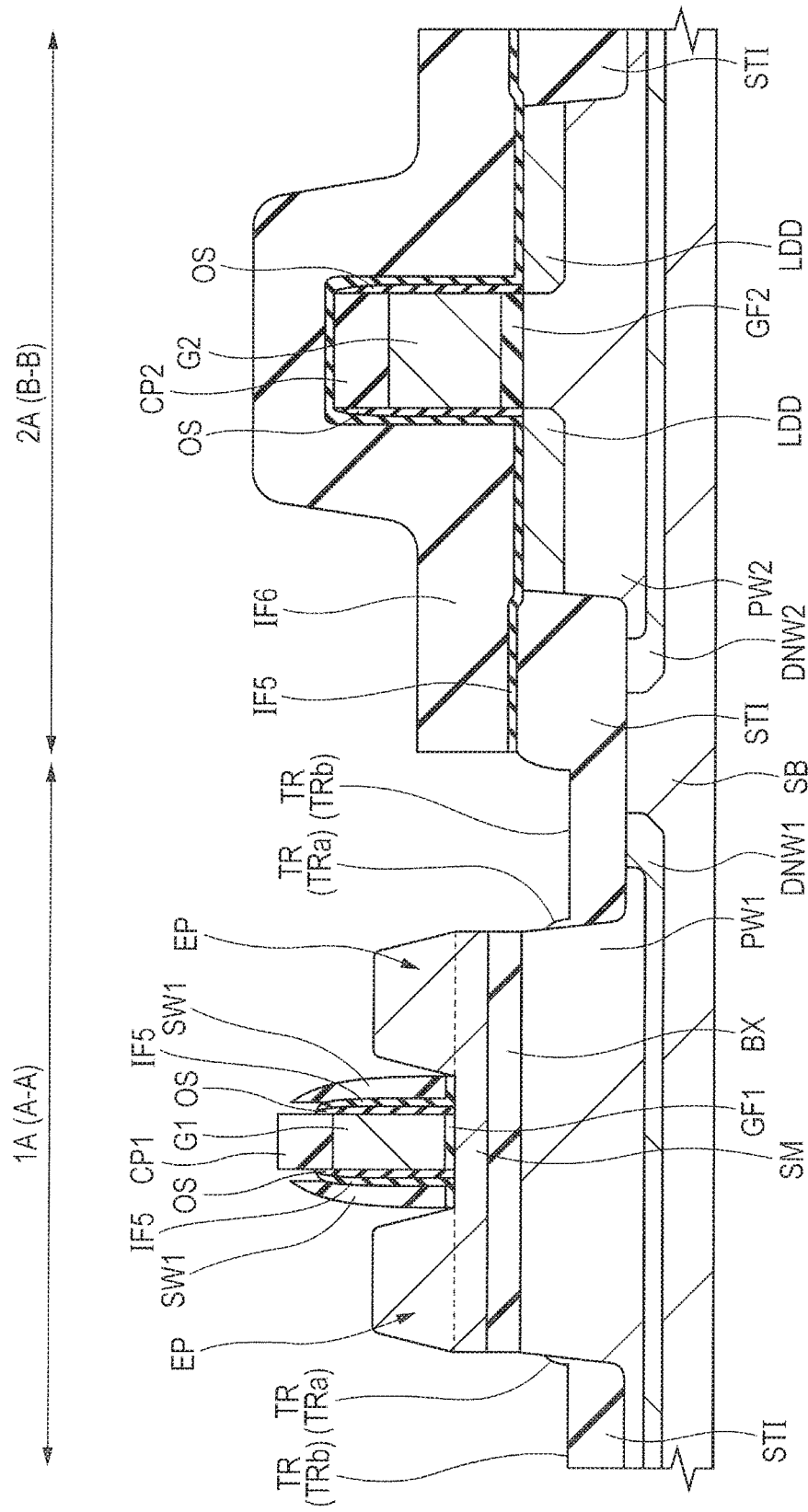
FIG. 27 is a cross-sectional view showing the manufacturing process of the semiconductor device following FIG. 26.

Next, as shown in FIG. 27, the anisotropy etching or the isotropic etching is performed on the element isolation portion ST1 in the area 1A. According to this, the element isolation portion ST1 in the area 1A is selectively etched, and the trench TR is formed within the element isolation portion ST1.

At the time of forming the trench TR, the cap film CP1, the sidewall spacer SW1, and the epitaxial layer EP in the area 1A, and the insulating film IF6 in the area 2A work as the etching stopper film. Therefore, similarly to the first embodiment, it is not necessary to provide an additional mask when forming the trench TR, hence to suppress the manufacturing cost.

In the second embodiment, since the trench TR is formed after forming the epitaxial layer EP, there is no fear of baring the side surface of the semiconductor substrate SB caused by forming the trench TR and forming the epitaxial layer EP on the side surface of the semiconductor substrate SB, differently from the first embodiment. In the second embodiment, the element isolation portion ST1 can be recessed to the position of baring the side surface of the semiconductor substrate SB. In other words, the side surface of the semiconductor substrate SB may not be covered with a part of the element isolation portion ST1. According to this, the position of the bottom TRb of the trench TR in the second embodiment is deeper than the bottom TRb of the trench TR in the first embodiment.

The film thickness of the element isolation portion ST1 removed for forming the trench TR, in other words, the distance from the surface of the element isolation portion ST1 before being removed to the bottom TRb of the trench TR is about 30 to 50 nm in the first embodiment; while, in the second embodiment, it is about 50 to 100 nm.

Any of the anisotropy etching or the isotropic etching may be used for the etching at the time of forming the trench TR; considering that the side surface of the insulating layer BX is a little recessed according to the isotropic etching, the anisotropy etching such as dry etching is preferable.

Then, the same manufacturing process as in FIGS. 18 to 20 according to the first embodiment is performed.

Figure 28:
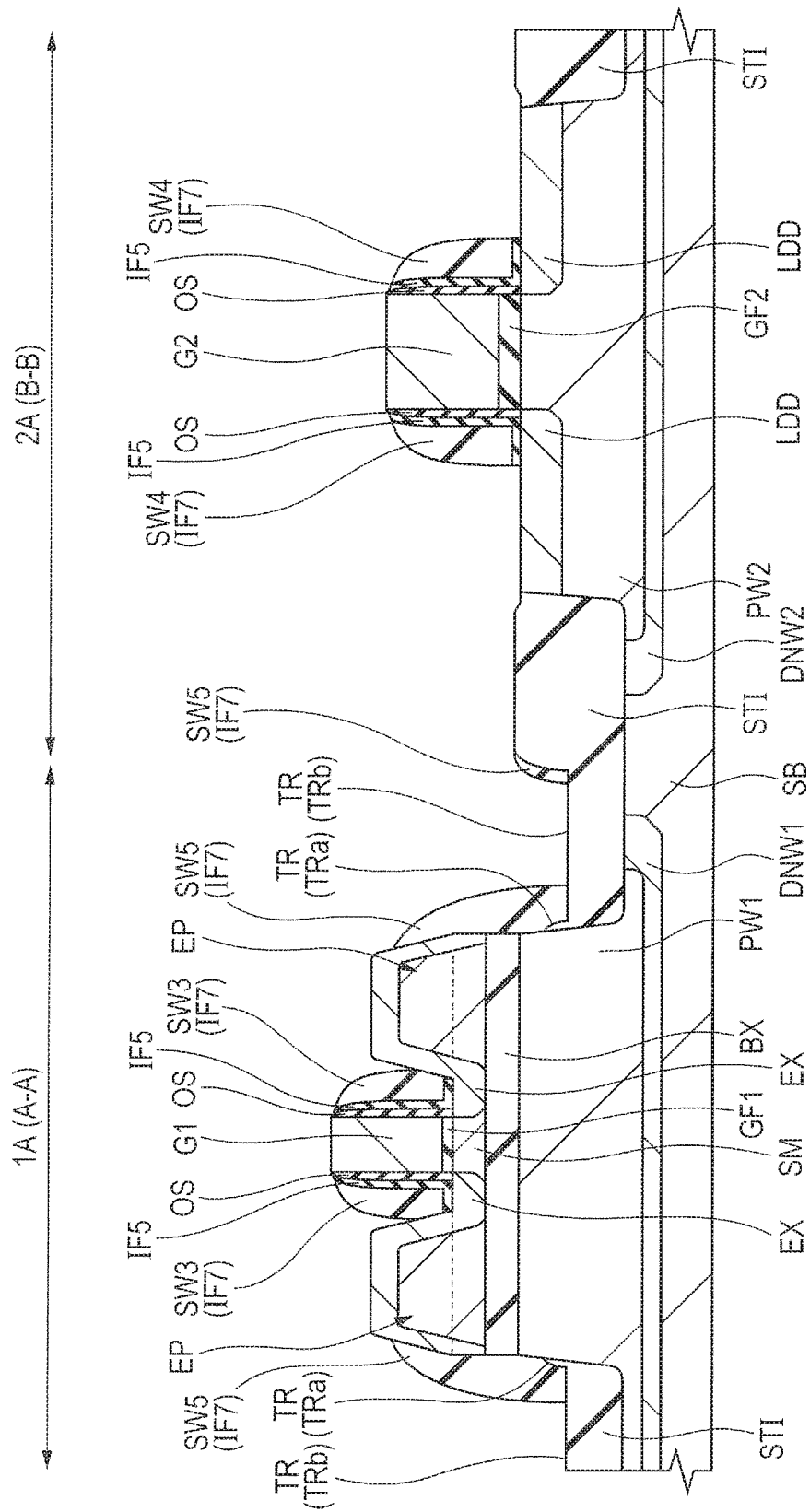
FIG. 28 is a cross-sectional view showing the manufacturing process of the semiconductor device following FIG. 27.

FIG. 28 is a cross-sectional view later than FIG. 27, showing the process corresponding to the process of forming the sidewall spacer SW5 as having been described in FIG. 21 of the first embodiment. Specifically, by processing the insulating film IF7 according to the anisotropy etching, the sidewall spacer SW5 is formed in the lateral side TRa of the trench TR. As mentioned above, in the second embodiment, at the time of forming the trench TR, the element isolation portion ST1 can be recessed to the position to bare the side surface of the semiconductor substrate SB. In this case, as shown in FIG. 28, the sidewall spacer SW5 is formed directly in contact with the side surface of the semiconductor substrate SB.

Thereafter, passing through the same manufacturing processes as shown in FIGS. 22 to 24 and FIG. 2, the semiconductor device according to the second embodiment is manufactured.

As mentioned above, the second embodiment can form the trench TR deeper than the first embodiment and the sidewall spacer SW5 can be formed higher (thicker). Accordingly, in the semiconductor device according to the second embodiment, when the plug is formed in a deviated position as having been described in FIG. 4, it is possible to suppress the problem of conducting the diffusion region D1 formed in the semiconductor layer SM with the well region PW1 formed in the semiconductor substrate SB more assuredly, hence to further improve the reliability of the semiconductor device.

As mentioned above, in addition to the same effects as the first embodiment, the technique described in the second embodiment can further improve the reliability of the semiconductor device.

MODIFIED EXAMPLE

Hereinafter, a modified example of the second embodiment will be described. In the following description, a different point from the second embodiment will be described.

In the second embodiment, after removing the insulating film IF5, the element isolation portion ST1 in the area 1A is a little etched, and after forming the epitaxial layer EP, the element isolation portion ST1 in the area 1A is etched, hence to form the trench TR within the element isolation portion ST1 in the area 1A.

On the contrary, in the modified example, after removing the insulating film IF5, the process of a little etching the element isolation portion ST1 in the area 1A (process of FIG. 25) is omitted. In other words, in the modified example, etching process of the element isolation portion ST1 for forming the trench TR is performed once after forming the epitaxial layer EP. Compared to the second embodiment, the manufacturing process can be simplified. The shape of the trench TR in the modified example is the same as in FIG. 27 in the second embodiment.

Thereafter, passing through the same processes as the second embodiment, the sidewall spacer SW5 is formed in the trench TR. The shape of the sidewall spacer SW5 in the modified example is the same as in FIG. 28 of the second embodiment.

As mentioned above, the technique described in the modified example can simplify the manufacturing process, in addition to the same effects as the second embodiment.

The etching amount at the time of forming the trench TR in the modified example is larger than that of the second embodiment. When a damage caused by the etching on the surface of the epitaxial layer EP is desired to be less, the method according to the second embodiment is more effective than the modified example.

As set forth hereinabove, the invention made by the inventor et al. has been specifically described based on the embodiments; however, the invention is not restricted to the above embodiments but needless to say, various modifications are possible without departing from its spirit.

What is claimed is:

1. A method of manufacturing a semiconductor device including a first region where a first MISFET is to be formed and a second region where a second MISFET is to be formed, comprising the steps of:
    (a) providing a semiconductor substrate, an insulating layer formed on the semiconductor substrate, and a semiconductor layer formed on the insulating layer;
    (b) forming an element isolation portion that penetrates the semiconductor layer and the insulating layer, and that has a bottom portion positioned in the semiconductor substrate;
    (c) removing the semiconductor layer in the second region and the insulating layer in the second region;
    (d) after the step (c), forming a first gate electrode and a first cap film located on the first gate electrode on the semiconductor layer in the first region, and forming a second gate electrode and a second cap film located on the second gate electrode on the semiconductor substrate in the second region;
    (e) after the step (d), forming a first insulating film so as to cover the semiconductor layer in the first region and the semiconductor substrate in the second region;
    (f) forming a first resist pattern, that does not cover the first region, and that covers the second region, on the first insulating film;
    (g) forming a first sidewall spacer on a side surface of the first gate electrode and a side surface of the first cap film, by performing an etching process on the first insulating film in the first region with the first resist pattern;
    (h) after the step (g), removing the first resist pattern;
    (i) after the step (h), selectively performing an etching process on the element isolation portion, thereby forming a trench in the element isolation portion in the first region such that the lowest part of a bottom portion thereof is located lower than the surface of the semiconductor substrate in the first region;

(j) forming a second sidewall spacer on a side portion of the trench so as to cover a side surface of the insulating layer in the first region;

(k) forming an impurity region in the semiconductor layer;

(l) forming an etching stopper film on the impurity region and the second sidewall spacer;

(m) forming an interlayer insulating film on the etching stopper film;

(n) forming a contact hole in each of the interlayer insulating film and the etching stopper film; and (o) forming a plug, which is electrically connected to the impurity region, inside of the contact hole.

2. The method according to claim 1, further comprising a step of:

(p) between the step (i) and the step (j), forming an epitaxial layer above the semiconductor layer.

3. The method according to claim 2,
wherein by performing the step (i) according to anisotropy etching, a part of the element isolation portion is left to cover the side surface of the semiconductor substrate in the first region, and
wherein in the step (j), the second sidewall spacer is formed in the side surface of the semiconductor substrate in the first region through the part of the element isolation portion.

4. The method according to claim 1, further comprising a step of:

(q) between the step (h) and the step (i), forming an epitaxial layer above the semiconductor layer.

5. The method according to claim 4,
wherein in the step (j), the second sidewall spacer is formed directly in contact with the side surface of the semiconductor substrate in the first region.

6. The method according to claim 5, further comprising a step of:

(r) between the step (h) and the step (q), recessing a surface of the element isolation portion not to bare the side surface of the semiconductor substrate in the first region.

7. The method according to claim 1, between the step (i) and the step (j), further comprising the steps of:

(s) removing the first cap film and the first sidewall spacer in the first region and removing the second cap film and the first insulating film in the second region; and (t) after the step (s), forming a second insulating film so as to cover the semiconductor layer in the first region and the semiconductor substrate in the second region,
wherein the step (j) is a step which is performed after the step (t), for forming the second sidewall spacer according to the anisotropy etching performed on the second insulating film, forming a third sidewall spacer on the side surface of the first gate electrode, and forming a fourth sidewall spacer on the side surface of the second gate electrode.

8. The method according to claim 1, further comprising a step of:

(u) between the step (d) and the step (e), forming a third insulating film on the side surface of the first gate electrode and the side surface of the first cap film,
wherein in the step (g), the first sidewall spacer is formed on the side surface of the first gate electrode and the side surface of the first cap film through the third insulating film, and
wherein a thickness of the first cap film is a thickness of the element isolation portion and more etched in the step (i).

9. The method according to claim 1, wherein the plug is formed in a way of overstriding the impurity region and the element isolation portion, and
wherein a bottom of the plug above the element isolation portion is positioned above the impurity region and the second sidewall spacer.

10. The method according to claim 9, wherein the element isolation portion and the interlayer insulating film are made of insulating film containing silicon oxide film, and
wherein the second sidewall spacer and the etching stopper film are made of insulating film containing silicon nitride film.

11. The method according to claim 10, wherein in the step (f), the first resist pattern is formed in a way of overstriding the element isolation portion and the semiconductor substrate in the second region, and
wherein in the step (g), the first insulating film in the second region covers a boundary portion between the element isolation portion and the semiconductor substrate in the second region.

* * * * *